United States Patent
Watanabe et al.

(10) Patent No.: US 10,686,291 B2
(45) Date of Patent: Jun. 16, 2020

(54) SEMICONDUCTOR LIGHT EMITTING ELEMENT AND SEMICONDUCTOR LIGHT EMITTING ELEMENT ASSEMBLY

(71) Applicant: Sony Corporation, Tokyo (JP)

(72) Inventors: Hideki Watanabe, Kanagawa (JP); Katsunori Yanashima, Kanagawa (JP); Rintaro Koda, Tokyo (JP); Moe Takeo, Tokyo (JP); Nobukata Okano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/556,970

(22) PCT Filed: Dec. 17, 2015

(86) PCT No.: PCT/JP2015/085329
§ 371 (c)(1),
(2) Date: Sep. 8, 2017

(87) PCT Pub. No.: WO2016/147512
PCT Pub. Date: Sep. 22, 2016

(65) Prior Publication Data
US 2018/0054039 A1 Feb. 22, 2018

(30) Foreign Application Priority Data
Mar. 19, 2015 (JP) .................... 2015-056280

(51) Int. Cl.
*H01S 5/14* (2006.01)
*H01S 5/022* (2006.01)
(Continued)

(52) U.S. Cl.
CPC .......... *H01S 5/02236* (2013.01); *H01S 5/024* (2013.01); *H01S 5/026* (2013.01);
(Continued)

(58) Field of Classification Search
CPC ........ H01S 5/02236; H01S 5/14; H01S 5/022; H01S 5/062; H01S 5/026; H01S 5/024; H01S 5/065; H01S 5/0658; H01S 5/0657
See application file for complete search history.

(56) References Cited

U.S. PATENT DOCUMENTS 5,625,616 A * 4/1997 Koike .................... H05B 45/58
369/53.26
5,987,044 A * 11/1999 Odagawa ............ H01S 5/06209
372/38.02
(Continued)

FOREIGN PATENT DOCUMENTS

EP 0618653 A2 * 10/1994 ......... H01S 5/06808
EP 2 838 169 2/2015
(Continued)

OTHER PUBLICATIONS

European Search Report dated Oct. 16, 2018 in corresponding European Application No. 15885604.7.
(Continued)

*Primary Examiner* — Yuanda Zhang
(74) *Attorney, Agent, or Firm* — K&L Gates LLP

(57) ABSTRACT

A semiconductor light emitting element has a laminated structure formed by laminating a first compound semiconductor layer, an active layer, and a second compound semiconductor layer. The semiconductor light emitting element satisfies $\Delta I_2 > \Delta I_1$, where $\Delta I_1$ is an operating current range when the temperature of the active layer is $T_1$, and $\Delta I_2$ is the operating current range when the temperature of the active layer is $T_2$ (where $T_2 > T_1$). The semiconductor light emitting element satisfies $P_2 > P_1$, where $P_1$ is a maximum optical output emitted when the temperature of the active layer is $T_1$, and $P_2$ is the maximum optical output emitted when the temperature of the active layer is $T_2$ (where $T_2 > T_1$).

18 Claims, 15 Drawing Sheets

(51) Int. Cl.
    *H01S 5/343*     (2006.01)
    *H01S 5/0625*     (2006.01)
    *H01S 5/06*     (2006.01)
    *H01S 5/024*     (2006.01)
    *H01S 5/026*     (2006.01)
    *H01S 5/065*     (2006.01)
    *H01S 5/10*     (2006.01)
    *H01S 5/22*     (2006.01)
    *H01S 5/50*     (2006.01)

(52) U.S. Cl.
    CPC .......... *H01S 5/0612* (2013.01); *H01S 5/0657* (2013.01); *H01S 5/06253* (2013.01); *H01S 5/14* (2013.01); *H01S 5/141* (2013.01); *H01S 5/34333* (2013.01); *H01S 5/02415* (2013.01); *H01S 5/0658* (2013.01); *H01S 5/101* (2013.01); *H01S 5/22* (2013.01); *H01S 5/50* (2013.01)

(56) References Cited

U.S. PATENT DOCUMENTS

| | | | |
|---|---|---|---|
| 6,362,910 B1* | 3/2002 | Tokita | H04B 10/504 372/34 |
| 2001/0046250 A1 | 11/2001 | Arbel et al. | |
| 2002/0054617 A1 | 5/2002 | Tsuda et al. | |
| 2004/0080814 A1 | 4/2004 | Ohki et al. | |
| 2008/0181267 A1* | 7/2008 | Imai | B82Y 20/00 372/29.011 |
| 2009/0219966 A1* | 9/2009 | Tan | B82Y 20/00 372/43.01 |
| 2010/0150194 A1* | 6/2010 | Tsuchiya | B82Y 20/00 372/45.01 |
| 2010/0246622 A1* | 9/2010 | Watanabe | B82Y 20/00 372/44.01 |
| 2011/0007765 A1* | 1/2011 | Kuramoto | B82Y 20/00 372/45.01 |
| 2012/0002271 A1* | 1/2012 | Kuramoto | H01S 5/1064 359/344 |
| 2012/0112204 A1* | 5/2012 | Kyono | B82Y 20/00 257/76 |
| 2012/0201259 A1* | 8/2012 | Watanabe | B82Y 20/00 372/36 |

FOREIGN PATENT DOCUMENTS

| | | |
|---|---|---|
| JP | 2002-094189 A | 3/2002 |
| JP | 2003-324237 A | 11/2003 |
| JP | 2014-175565 A | 9/2014 |
| WO | 2013/153999 A1 | 10/2013 |
| WO | 2014/126164 A1 | 8/2014 |

OTHER PUBLICATIONS

Japanese Office Action dated Aug. 20, 2019 in corresponding Japanese Application No. 2017-506033.
Japanese Office Action dated Mar. 24, 2020 in corresponding Japanese Application No. 2017-506033.

* cited by examiner

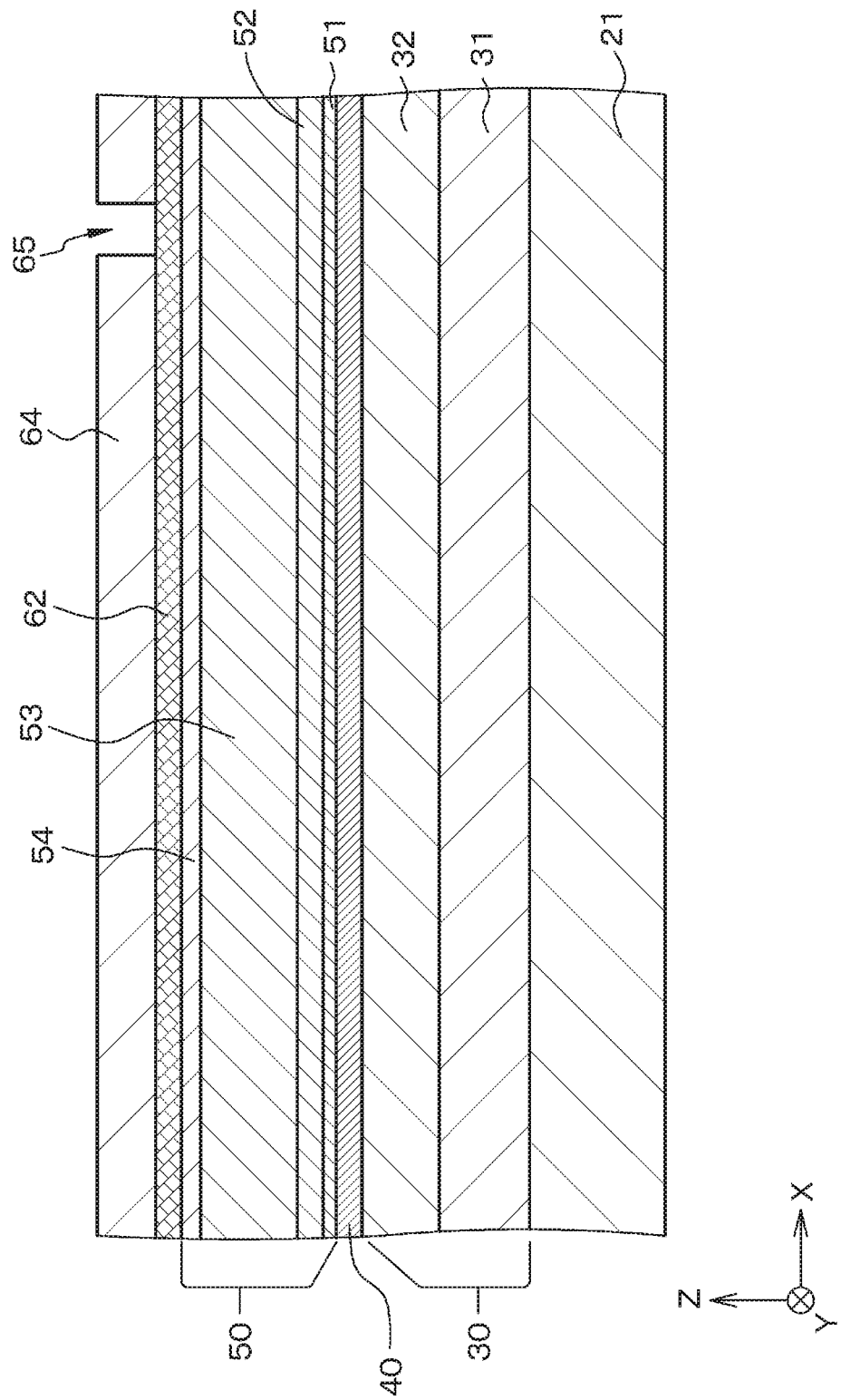

SEMICONDUCTOR LIGHT EMITTING ELEMENT AND SEMICONDUCTOR LIGHT EMITTING ELEMENT ASSEMBLY

CROSS-REFERENCE TO RELATED APPLICATIONS

The present application claims the benefit of International Application No. PCT/JP2015/085329, filed Dec. 17, 2015, which claims priority to Japanese Application No. 2015-056280, filed Mar. 19, 2015, the disclosures of which are incorporated herein by reference.

BACKGROUND

The present disclosure relates to a semiconductor light emitting element and a semiconductor light emitting element assembly.

Generally, a decrease in optical output of a semiconductor laser element is observed when the temperature of an active layer rises. This phenomenon is caused by, for example,
(A) an increase in reactive current due to an overflow,
(B) increases in non-radiative recombination and carrier plasma absorption due to an increase in carrier density, and
(C) hot electron effect.

Accordingly, in the past, measures of lowering the temperature of the active layer by reducing thermal resistance and lowering the temperature of the active layer by using a heat sink, for example, have been taken for higher output of the semiconductor laser element.

For example, JP 2014-175565A discloses a semiconductor laser device formed by bonding a semiconductor laser element onto the surface of a sub-mount in the shape of a flat plate via a first soldering layer, and bonding the sub-mount, to which the semiconductor laser element is bonded, onto the surface of a heat sink via a second soldering layer.

CITATION LIST

Patent Literature

[PTL 1]
JP 2014-175565A

SUMMARY

Technical Problem

The above-described patent laid-open publication explains that heat from the semiconductor laser element can be exhausted sufficiently. However, a technology of achieving an increase in optical output by raising the temperature of the active layer is not known as far as the present inventors researched.

Accordingly, it is an object of the present disclosure to provide a semiconductor light emitting element that can achieve an increase in optical output and a semiconductor light emitting element assembly including such a semiconductor light emitting element.

Solution to Problem

Semiconductor light emitting element assemblies according to a first mode and a second mode of the present disclosure for achieving the above-described object include a semiconductor light emitting element having a laminated structure formed by laminating a first compound semiconductor layer, an active layer, and a second compound semiconductor layer. In addition, semiconductor light emitting elements according to the first mode and the second mode of the present disclosure for achieving the above-described object have a laminated structure formed by laminating a first compound semiconductor layer, an active layer, and a second compound semiconductor layer.

Then, the semiconductor light emitting element assembly according to the first mode of the present disclosure or the semiconductor light emitting element according to the first mode of the present disclosure satisfies $$\Delta I_2 > \Delta I_1$$

where $\Delta I_1$ is an operating current range when temperature of the active layer is $T_1$, and $\Delta I_2$ is the operating current range when the temperature of the active layer is $T_2$ (where $T_2 > T_1$). In the following description, the semiconductor light emitting element in the semiconductor light emitting element assembly according to the first mode of the present disclosure and the semiconductor light emitting element according to the first mode of the present disclosure may be referred to collectively as a "semiconductor light emitting element according to the first mode of the present disclosure or the like."

In addition, the semiconductor light emitting element assembly according to the second mode of the present disclosure or the semiconductor light emitting element according to the second mode of the present disclosure satisfies $$P_2 > P_1$$

where $P_1$ is a maximum optical output emitted when temperature of the active layer is $T_1$, and $P_2$ is the maximum optical output emitted when the temperature of the active layer is $T_2$ (where $T_2 > T_1$).

In the following description, the semiconductor light emitting element in the semiconductor light emitting element assembly according to the second mode of the present disclosure and the semiconductor light emitting element according to the second mode of the present disclosure may be referred to collectively as a "semiconductor light emitting element according to the second mode of the present disclosure or the like."

Advantageous Effects of Invention

The semiconductor light emitting element according to the first mode of the present disclosure or the like satisfies the relation $\Delta I_2 > \Delta I_1$. Therefore, the higher the temperature of the active layer, the wider the operating current range. As a result, an increase in optical output can be achieved. The semiconductor light emitting element according to the second mode of the present disclosure or the like satisfies $P_2 > P_1$. Therefore, the higher the temperature of the active layer, the higher the maximum optical output. An increase in optical output can therefore be achieved. Moreover, because a pulsed laser in a 400-nm wavelength band with a high peak output can be realized by a single body of a semiconductor light emitting element (for example, a mode-locked semiconductor laser element), sources of ultrashort pulsed light on the order of femtoseconds can be put into widespread use, and in some cases, power saving can be achieved because of no need for cooling the semiconductor light emitting element. Incidentally, effects described in the present specifi-

BRIEF DESCRIPTION OF DRAWINGS

FIG. 14, continued from FIG. 13B, is a schematic partial end view of the substrate and the like, the schematic partial end view being of assistance in explaining the method of manufacturing the mode-locked semiconductor laser element according to the first embodiment.

DETAILED DESCRIPTION

Figure 1A:
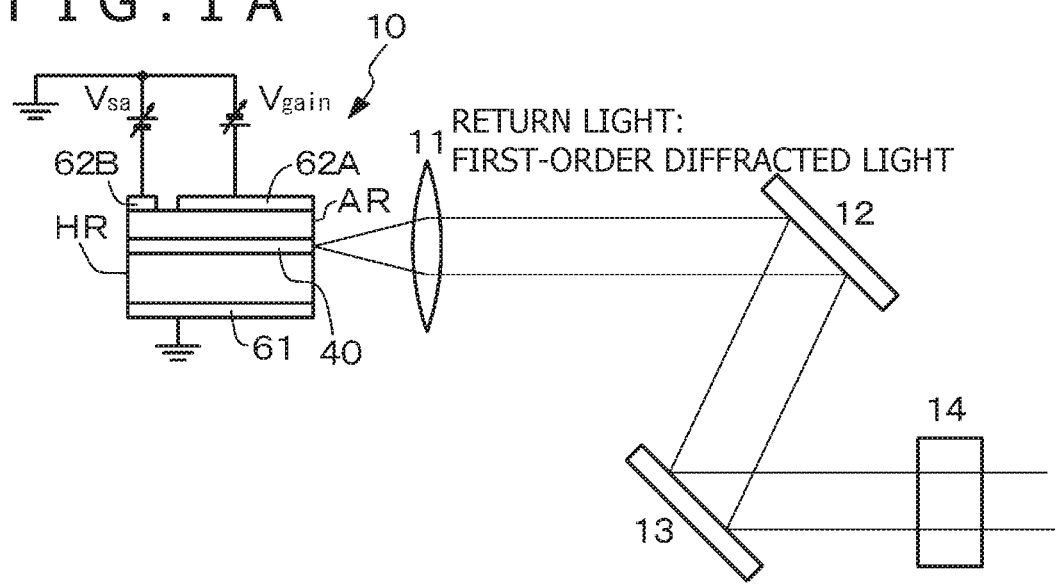
FIG. 1A and FIG. 1B are conceptual diagrams of semiconductor light emitting elements according to a first embodiment and a second embodiment, respectively.

The present disclosure will hereinafter be described on the basis of embodiments with reference to the drawings. However, the present disclosure is not limited to the embodiments, and various numerical values and materials in the embodiments are illustrative. Incidentally, the description will be made in the following order.

1. Semiconductor Light Emitting Element Assemblies according to First Mode and Second Mode of Present Disclosure and Semiconductor Light Emitting Elements according to First Mode and Second Mode of Present Disclosure, and General Description
2. First Embodiment (Semiconductor Light Emitting Element Assemblies according to First Mode and Second Mode of Present Disclosure and Semiconductor Light Emitting Elements according to First Mode and Second Mode of Present Disclosure)
3. Second Embodiment (Modification of First Embodiment)
4. Third Embodiment (Another Modification of First Embodiment)
5. Others <Semiconductor Light Emitting Element Assemblies According to First Mode and Second Mode of Present Disclosure and Semiconductor Light Emitting Elements According to First Mode and Second Mode of Present Disclosure, and General Description>

In a semiconductor light emitting element according to a first mode of the present disclosure or the like, an operating current when an optical pulse repetition frequency f changes from a fundamental frequency determined by the distance of an optical system to a frequency twice the fundamental frequency can be an upper limit value of an operating current range. Incidentally, a round-trip time determined by the length of an external resonator structure to be described next is proportional to a reciprocal of the repetition frequency f. In addition, the semiconductor light emitting element according to the first mode of the present disclosure or the like including such a preferable form can satisfy $$I_{max-2} > I_{max-1}$$

where $I_{max-1}$ is the upper limit value of the operating current range when the temperature of an active layer is $T_1$, and $I_{max-2}$ is the upper limit value of the operating current range when the temperature of the active layer is $T_2$.

Here, the above-described optical system in semiconductor light emitting element assemblies according to the first mode and a second mode of the present disclosure can include, for example, a semiconductor light emitting element and an optical member. Specifically, when two end surfaces of the semiconductor light emitting element are a first end surface and a second end surface, the first end surface being a light reflecting surface, and the second end surface being a light emitting surface, light emitted from the second end surface of the semiconductor light emitting element can collide with the optical member, a part of the light can be returned to the semiconductor light emitting element, and the remaining light can be emitted to the outside. The first end surface of the semiconductor light emitting element and the optical member constitute an external resonator structure. In this case, the distance of the optical system is the length of the external resonator structure. The optical member can be, for example, a diffraction grating on which uneven portions or groove portions in a lattice form are formed, a semitransparent mirror, or a reflecting mirror. The diffraction grating can, for example, be configured to return, to the semiconductor light emitting element, first-order diffracted light of light emitted from the semiconductor light emitting element, and emit, to the outside, zeroth-order diffracted light of the light emitted from the semiconductor light emitting element. The number of lines of a pattern in the lattice form in the diffraction grating can be, for example, 1200 lines/mm to 3600 lines/mm, preferably 2400 lines/mm to 3600 lines/mm. Collimating means (specifically a lens) for converting the light from the semiconductor light emitting element into a collimated light beam may be disposed between the semiconductor light emitting element and the optical member, or condensing means (specifically a lens) for condensing the light from the semiconductor light emitting element onto the optical member may be disposed between the semiconductor light emitting element and the optical member. That is, in a case where the external resonator structure is provided, the semiconductor light emitting element may be of a condensing type or may be of a collimating type.

Further, the semiconductor light emitting element assemblies according to the first mode and the second mode of the present disclosure including the various kinds of preferable forms described above further include a heat sink and a sub-mount, and the heat sink, the sub-mount, and the semiconductor light emitting element can be sequentially laminated. Here, materials for forming the sub-mount include AlN, Si, SiC, Cu, W, Mo, Al, and diamond, or Cu—W, Al—SiC, and the like as composite materials including these materials. Materials for forming the heat sink include Cu, Fe, Al, Au, W, and Mo, or Cu—W, Cu—Mo, and the like as composite materials including these materials. Incidentally, the heat sink and the sub-mount can be laminated via a first soldering layer,
the sub-mount and the semiconductor light emitting element can be laminated via a second soldering layer,
the area of the first soldering layer relative to the area of the sub-mount can be, without being limited to, 0.2 to 0.8, and/or the area of the second soldering layer formed on the sub-mount relative to the area of the semiconductor light emitting element can be, without being limited to, 0.2 to 0.8. Thus setting the area of the first soldering layer relative to the area of the sub-mount and/or the area of the second soldering layer formed on the sub-mount relative to the area of the semiconductor light emitting element to 0.8 or less can more reduce heat generated in the semiconductor light emitting element and transmitted to the heat sink, and can thus provide a so-called thermal storage structure. It is therefore possible to maintain the temperature of the active layer at a desired high temperature. Another thermal storage structure for holding the temperature of the active layer high can be obtained also by reducing an area of contact between the sub-mount and the heat sink or an area of contact between the sub-mount and the semiconductor light emitting element to 0.8 or less or by inserting a material having a low thermal conductivity of 50 W/mK or less at a contact interface between the sub-mount and the heat sink or a contact interface between the sub-mount and the semiconductor light emitting element.

Further, in the semiconductor light emitting element assemblies according to the first mode and the second mode of the present disclosure including the various kinds of preferable forms described above, the temperature of the active layer can be controlled by the heat sink. In this case, the temperature of the active layer can be controlled by heating the heat sink.

Further, in the semiconductor light emitting elements according to the first mode and the second mode of the present disclosure or the like including the various kinds of preferable forms described above, a laminated structure can have a structure in which a light emitting region and a saturable absorption region are juxtaposed to each other in a resonator direction. In this case, the saturable absorption region can be disposed in an end region of the laminated structure in the resonator direction. Further, in these cases, a current fed through the light emitting region can be $1 \times 10^2$ amperes/cm$^2$ to $1 \times 10^5$ amperes/cm$^2$ per unit area of the light emitting region.

Alternatively, in the semiconductor light emitting elements according to the first mode and the second mode of the present disclosure or the like including the various kinds of preferable forms described above, the laminated structure can have a structure in which a plurality of functional regions are integrated. In this case, at least one of the plurality of functional regions can be formed by a saturable absorption region. The functional regions also include a gain region, a saturable absorption region, a phase control region, a distributed feedback region, a distributed Bragg reflection region, and the like.

The semiconductor light emitting elements according to the first mode and the second mode of the present disclosure or the like including the various kinds of preferable forms described above (these semiconductor light emitting elements may hereinafter be referred to collectively as a "semiconductor light emitting element according to the present disclosure or the like") can be constituted of a semiconductor light emitting element including a light emitting region and a saturable absorption region as described above, specifically a mode-locked semiconductor laser element including a light emitting region and a saturable absorption region. Incidentally, in a mode-locked semiconductor laser element of a conventional optically pumped type, the temperature characteristics of a semiconductor saturable absorber (SESAM) is used to control oscillation characteristics. However, in the form in which the saturable absorption region is provided, the oscillation characteristics can be controlled on the basis of a reverse bias voltage $V_{sa}$ to the saturable absorption region, and thus the oscillation characteristics is controlled easily. In addition, the semiconductor light emitting element assemblies according to the first mode and the second mode of the present disclosure including the preferable forms and configurations described above (which semiconductor light emitting element assemblies may hereinafter be referred to collectively as a "semiconductor light emitting element assembly according to the present disclosure") can be provided with a semiconductor optical amplifier (SOA).

The semiconductor laser element (laser diode (LD)) emits light generated in the active layer from the second end surface of the laminated structure to the outside. That is, a resonator is formed by optimizing the optical reflectance of the first end surface of the laminated structure and the optical reflectance of the second end surface of the laminated structure, and the light is emitted from the second end surface. The semiconductor optical amplifier (SOA) directly amplifies an optical signal in a state of light without converting the optical signal into an electric signal. The semiconductor optical amplifier has a laser structure in which a resonator effect is eliminated as much as possible. The semiconductor optical amplifier amplifies incident light on the basis of the optical gain of the semiconductor optical amplifier. In the semiconductor optical amplifier, the optical reflectances of the first end surface and the second end surface in the laminated structure are set at a very low value, and thus without a resonator being formed, the light incident from the first end surface is amplified and emitted from the second end surface. A monolithic type can also be formed in which the semiconductor light emitting element and the semiconductor optical amplifier are integral with each other.

The mode-locked semiconductor laser element or the semiconductor optical amplifier can more specifically include the following: a laminated structure formed by sequentially laminating, on a base,
a first compound semiconductor layer formed of a GaN-based compound semiconductor and having a first conductivity type,
a third compound semiconductor layer (active layer) formed of a GaN-based compound semiconductor, and
a second compound semiconductor layer formed of a GaN-based compound semiconductor and having a second conductivity type different from the first conductivity type;
a second electrode formed on the second compound semiconductor layer; and
a first electrode electrically connected to the first compound semiconductor layer.

Incidentally, the first compound semiconductor layer is formed on the substrate or the base.

Specifically, the mode-locked semiconductor laser element can be formed by a mode-locked semiconductor laser element of a bisection type in which the light emitting region and the saturable absorption region are juxtaposed to each other in the resonator direction, and the second electrode can be divided, by a dividing groove, into a first part for producing a forward bias state by feeding a direct current to the first electrode via the light emitting region and a second part for applying an electric field to the saturable absorption region. Then, an electric resistance value between the first part and the second part of the second electrode is equal to or more than $1\times10$ times an electric resistance value between the second electrode and the first electrode, preferably equal to or more than $1\times10^2$ times the electric resistance value between the second electrode and the first electrode, more preferably equal to or more than $1\times10^3$ times the electric resistance value between the second electrode and the first electrode. Such a mode-locked semiconductor laser element will be referred to as a "mode-locked semiconductor laser element of a first configuration" for convenience. Alternatively, the electric resistance value between the first part and the second part of the second electrode is equal to or more than $1\times10^2\Omega$, preferably equal to or more than $1\times10^3\Omega$, more preferably equal to or more than $1\times10^4\Omega$. Such a mode-locked semiconductor laser element will be referred to as a "mode-locked semiconductor laser element of a second configuration" for convenience. In the mode-locked semiconductor laser element of the first configuration or the second configuration, a forward bias state is set by feeding a direct current from the first part of the second electrode to the first electrode via the light emitting region, and an electric field is applied to the saturable absorption region by applying a voltage (reverse bias voltage $V_{sa}$) between the first electrode and the second part of the second electrode. The mode-locked semiconductor laser element can therefore be made to perform mode-locked operation.

In such a mode-locked semiconductor laser element of the first configuration or the second configuration, the flow of a leakage current from the first part to the second part of the second electrode can be surely suppressed by setting the electric resistance value between the first part and the second part of the second electrode equal to or more than 10 times the electric resistance value between the second electrode and the first electrode, or equal to or more than $1\times10^2\Omega$. That is, mode-locked operation having laser light with a shorter pulse time width can be realized because the reverse bias voltage $V_{sa}$ applied to the saturable absorption region (carrier non-injection region) can be raised. Then, such a high electric resistance value between the first part and the second part of the second electrode can be achieved merely by dividing the second electrode into the first part and the second part by the dividing groove.

In addition, in the mode-locked semiconductor laser elements of the first configuration and the second configuration, though not limited,
the third compound semiconductor layer (active layer) can have a quantum well structure including a well layer and a barrier layer,
the thickness of the well layer can be between 1 nm and 10 nm both inclusive, preferably between 1 nm and 8 nm both inclusive, and
the impurity doping concentration of the barrier layer can be between $2\times10^{18}$ cm$^{-3}$ and $1\times10^{20}$ cm$^{-3}$ both inclusive, preferably between $1\times10^{19}$ cm$^{-3}$ and $1\times10^{20}$ cm$^{-3}$ both inclusive. Such a mode-locked semiconductor laser element may be referred to as a "mode-locked semiconductor laser element of a third configuration" for convenience. By adopting the quantum well structure in the active layer, it is possible to achieve a larger amount of injection current than in a case where a quantum dot structure is adopted, and thus possible to obtain a high power easily.

By thus defining the thickness of the well layer constituting the third compound semiconductor layer as between 1 nm and 10 nm both inclusive and further defining the impurity doping concentration of the barrier layer constituting the third compound semiconductor layer as between $2\times10^{18}$ cm$^{-3}$ and $1\times10^{20}$ cm$^{-3}$ both inclusive, that is, by reducing the thickness of the well layer and increasing carriers of the third compound semiconductor layer, it is possible to reduce an effect of piezopolarization, and possible to obtain a laser light source capable of generating single-peaked laser light having a short pulse time width and a small sub-pulse component. In addition, it is possible to achieve mode-locked driving with a low reverse bias voltage $V_{sa}$, and possible to generate a laser light pulse train synchronized with external signals (an electric signal and an optical signal). An impurity with which to dope the barrier layer can be silicon (Si). However, without being limited to this, the impurity can also be oxygen (O).

The semiconductor light emitting element according to the present disclosure or the like can be a semiconductor laser element having a separate confinement heterostructure (SCH) of a ridge stripe type. Alternatively, the semiconductor light emitting element according to the present disclosure or the like can be a semiconductor laser element having a separate confinement heterostructure of an oblique ridge stripe type. That is, the axis of the semiconductor light emitting element and the axis of the ridge stripe structure can be configured to intersect each other at a predetermined angle. Here, the predetermined angle $\theta$ can be, for example, 0.1 degrees$\leq\theta\leq$10 degrees, preferably 0.1 degrees$\leq\theta\leq$6 degrees. The axis of the ridge stripe structure is a straight line that connects a middle point of both ends of the ridge stripe structure in the light emitting end surface (second end surface) to a middle point of both ends of the ridge stripe structure in the end surface (first end surface) of the laminated structure on an opposite side from the light emitting end surface (second end surface). In addition, the axis of the semiconductor light emitting element refers to an axis orthogonal to the first end surface and the second end surface. A planar shape of the ridge stripe structure may be a linear shape, or may be a curved shape.

Alternatively, in the semiconductor light emitting element according to the present disclosure or the like, letting $W_2$ be the width of the ridge stripe structure in the second end surface, and letting $W_1$ be the width of the ridge stripe structure in the first end surface, $W_1=W_2$ may be satisfied, or $W_2>W_1$ may be satisfied. $W_2$ can be equal to or more than 5 μm. An upper limit value of $W_2$ can be, without being limited to, $4\times10^2$ μm, for example. In addition, $W_1$ can be 1.4 to 2.0 μm. Each end portion of the ridge stripe structure may be constituted of one line segment, or may be constituted of two line segments or more. In the former case, the width of the ridge stripe structure can, for example, be monotonically and gently increased from the first end surface to the second end surface in a tapered shape (flared shape). In the latter case, on the other hand, the width of the ridge stripe structure can, for example, be the same from the first end surface to the second end surface first, and then monotonically and gently increased in a tapered shape. Alternatively, the width of the ridge stripe structure can, for example, be increased from the first end surface to the second end surface first, and then decreased after exceeding a maximum width.

When the semiconductor light emitting element according to the present disclosure or the like is formed by a semiconductor laser element, the optical reflectance of the second end surface of the laminated structure from which end surface a light beam (light in a pulse form) is emitted is preferably equal to or less than 0.5%. Specifically, a low-reflection coating layer can be formed on the second end surface. Here, the low-reflection coating layer is, for example, formed by a laminated structure of at least two kinds of layers selected from a group including a titanium oxide layer, a tantalum oxide layer, a zirconium oxide layer, a silicon oxide layer, and an aluminum oxide layer. Incidentally, this optical reflectance value is significantly lower than the optical reflectance (usually 5% to 10%) of one end surface of a laminated structure from which end surface a laser light beam (laser light in a pulse form) is emitted in a conventional semiconductor laser element. In addition, it is desirable that the first end surface have a high optical reflectance, for example, a reflectance of 85% or more, preferably a high reflectance of 95% or more.

It is desirable that the value of an external resonator length ($X'$, unit: mm) in the external resonator structure be $$0<X'<1500$$

preferably, $$30 \leq X' \leq 500$$

Here, the external resonator structure is as described above. When the semiconductor light emitting element according to the present disclosure or the like is formed by a semiconductor laser element, the laminated structure has a ridge stripe structure constituted of at least a part in a thickness direction of the second compound semiconductor layer. However, this ridge stripe structure may be constituted of only the second compound semiconductor layer, may be constituted of the second compound semiconductor layer and the third compound semiconductor layer (active layer), or may be constituted of the second compound semiconductor layer, the third compound semiconductor layer (active layer), and a part in the thickness direction of the first compound semiconductor layer. In forming the ridge stripe structure, it suffices to pattern the compound semiconductor layer by a dry etching method, for example.

In the mode-locked semiconductor laser element, though not limited, it is desirable that
the width of the second electrode be between 0.5 μm and 50 μm both inclusive, preferably between 1 μm and 5 μm both inclusive, the height of the ridge stripe structure be 0.1 μm and 10 μm both inclusive, preferably between 0.2 μm and 1 μm both inclusive, and
the width of the dividing groove that divides the second electrode into the first part and the second part be equal to or more than 1 μm and equal to or less than 50% of a resonator length in the mode-locked semiconductor laser element (which resonator length in the mode-locked semiconductor laser element will hereinafter be referred to simply as a "resonator length"), preferably equal to or more than 10 μm and equal to or less than 10% of the resonator length. The resonator length can be, for example, 0.6 mm, but is not limited to this. A distance (D) from a top surface of a part of the second compound semiconductor layer which part is located outside both side surfaces of the ridge stripe structure to the third compound semiconductor layer (active layer) is preferably equal to or more than $1.0\times10^7$ m (0.1 μm). By thus defining the distance (D), it is possible to surely form the saturable absorption region on both sides (Y-direction) of the third compound semiconductor layer. It suffices to determine an upper limit of the distance (D) on the basis of an increase in threshold current, temperature characteristics, a degradation in a rate of increase in current during a long period of driving, and the like. Incidentally, in the following description, the direction of the resonator length will be set as an X-direction, and the thickness direction of the laminated structure will be set as a Z-direction.

Further, in the semiconductor light emitting element according to the present disclosure or the like, the second electrode can, for example, be formed of a single layer of palladium (Pd), a single layer of nickel (Ni), a single layer of platinum (Pt), a laminated structure of palladium layer/platinum layer in which structure a palladium layer is in contact with the second compound semiconductor layer, or a laminated structure of palladium layer/nickel layer in which structure a palladium layer is in contact with the second compound semiconductor layer. Incidentally, in the case where a lower metal layer is formed of palladium, and an upper metal layer is formed of nickel, it is desirable that the thickness of the upper metal layer be equal to or more than 0.1 μm, preferably equal to or more than 0.2 μm. Alternatively, the second electrode is preferably formed of a single layer of palladium (Pd). In this case, it is desirable that the thickness be equal to or more than 20 nm, preferably equal to or more than 50 nm. Alternatively, the second electrode is preferably formed of a single layer of palladium (Pd), a single layer of nickel (Ni), a single layer of platinum (Pt), or a laminated structure of a lower metal layer and an upper metal layer in which structure the lower metal layer is in contact with the second compound semiconductor layer (where the lower metal layer is formed of one kind of metal selected from a group including palladium, nickel, and platinum, and the upper metal layer is formed of a metal in which an etching rate when the dividing groove is formed in the second electrode in a process (D) to be described later is the same as or nearly equal to the etching rate of the lower metal layer or higher than the etching rate of the lower metal layer). In addition, an etchant when the dividing groove is formed in the second electrode in the process (D) to be described later is preferably aqua regia, nitric acid, sulfuric acid, hydrochloric acid, or a mixture of at least two kinds of acids of these acids (specifically a mixture of nitric acid and sulfuric acid or a mixture of sulfuric acid and hydrochloric acid).

In the mode-locked semiconductor laser element of the first configuration or the second configuration including the preferable forms and configurations described above, the length of the saturable absorption region can be shorter than the length of the light emitting region. Alternatively, the length of the second electrode (total length of the first part and the second part) can be shorter than the length of the third compound semiconductor layer (active layer). Arrangement states of the first part and the second part of the second electrode include, specifically, (1) a state in which one first part of the second electrode and one second part of the second electrode are provided, and the first part of the second electrode and the second part of the second electrode are arranged with a dividing groove interposed therebetween, (2) a state in which one first part of the second electrode and two second parts of the second electrode are provided, one end of the first part is opposed to one second part with one dividing groove interposed therebetween, and another end of the first part is opposed to the other second part with another dividing groove interposed therebetween, and (3) a state in which two first parts of the second electrode and one second part of the second electrode are provided, an end portion of the second part is opposed to one first part with one dividing groove interposed therebetween, and another end of the second part is opposed to the other first part with another dividing groove interposed therebetween (that is, the second electrode has a structure in which the second part is interposed between the first parts).

In addition, broadly, the following states are included:

(4) a state in which N first parts of the second electrode and (N−1) second parts of the second electrode are provided, and the first parts of the second electrode are arranged with the second parts of the second electrode interposed therebetween, and (5) a state in which N second parts of the second electrode and (N−1) first parts of the second electrode are provided, and the second parts of the second electrode are arranged with the first parts of the second electrode interposed therebetween. The states of (4) and (5) are, in other words, (4') a state in which N light emitting regions (carrier injection regions or gain regions) and N−1 saturable absorption regions (carrier non-injection regions) are provided, and the light emitting regions are arranged with the saturable absorption regions interposed therebetween, and (5') a state in which N saturable absorption regions (carrier non-injection regions) and (N−1) light emitting regions (carrier injection regions or gain regions) are provided, and the saturable absorption regions are arranged with the light emitting regions interposed therebetween.

When the structures of (3), (5), and (5') are employed, damage in the light emitting end surface of the mode-locked semiconductor laser element does not easily occur.

The mode-locked semiconductor laser element can be manufactured by the following method, for example. That is, the mode-locked semiconductor laser element can be manufactured on the basis of a manufacturing method including the following processes:

(A) forming a laminated structure by sequentially laminating, on a base, a first compound semiconductor layer having a first conductivity type and formed of a GaN-based compound semiconductor, a third compound semiconductor layer formed of a GaN-based compound semiconductor and constituting a light emitting region and a saturable absorption region, and a second compound semiconductor layer having a second conductivity type different from the first conductivity type and formed of a GaN-based compound semiconductor;

(B) then forming a second electrode in a band shape on the second compound semiconductor layer;

(C) next forming a ridge stripe structure by etching at least a part of the second compound semiconductor layer with the second electrode used as an etching mask; and (D) then forming a resist layer for forming a dividing groove in the second electrode, and next forming the dividing groove in the second electrode by a wet etching method with the resist layer used as a wet etching mask, thereby dividing the second electrode into the first part and the second part by the dividing groove.

In addition, because such a manufacturing method is adopted, that is, because the ridge stripe structure is formed by etching at least a part of the second compound semiconductor layer with the second electrode in a band shape used as an etching mask, that is, because the ridge stripe structure is formed by a self-alignment system with the patterned second electrode used as an etching mask, no misalignment occurs between the second electrode and the ridge stripe structure. In addition, the dividing groove is formed in the second electrode by a wet etching method. Thus employing the wet etching method, unlike a dry etching method, can suppress occurrence of degradation in optical and electrical characteristics of the second compound semiconductor layer. Accordingly, occurrence of degradation in light emission characteristics can be surely prevented.

In the process (C), the second compound semiconductor layer may be etched partially in the thickness direction, the second compound semiconductor layer may be etched entirely in the thickness direction, the second compound semiconductor layer and the third compound semiconductor layer may be etched in the thickness direction, or the second compound semiconductor layer, the third compound semiconductor layer, and a part of the first compound semiconductor layer may be etched in the thickness direction.

Further, it is desirable to satisfy $ER_0/ER_1 \geq 1 \times 10$, preferably $ER_0/ER_1 \geq 1 \times 10^2$, where $ER_0$ is the etching rate of the second electrode and $ER_1$ is the etching rate of the laminated structure when the dividing groove is formed in the second electrode in the process (D). When $ER_0/ER_1$ satisfies such a relation, the second electrode can be etched surely without the laminated structure being etched (or with the laminated structure etched slightly even if etched).

In the semiconductor light emitting element according to the present disclosure or the like, the laminated structure can be specifically formed of AlInGaN-based compound semiconductors. Here, the AlInGaN-based compound semiconductors more specifically include GaN, AlGaN, InGaN, and AlInGaN. Further, if desired, these compound semiconductors may include boron (B) atoms, thallium (Tl) atoms, arsenic (As) atoms, phosphorus (P) atoms, and antimony (Sb) atoms. In addition, the third compound semiconductor layer (active layer) preferably has a quantum well structure. Specifically, the third compound semiconductor layer (active layer) may have a single quantum well structure (SQW structure), or may have a multiple quantum well structure (MQW structure). The third compound semiconductor layer (active layer) having the quantum well structure has a structure in which at least one well layer and one barrier layer are laminated. Combinations of (a compound semiconductor constituting the well layer, a compound semiconductor constituting the barrier layer) can be, for example, ($In_yGa_{(1-y)}N$, GaN), ($In_yGa_{(1-y)}N$, $In_zGa_{(1-z)}N$) (where y>z), and ($In_yGa_{(1-y)}N$, AlGaN).

Further, in the semiconductor light emitting element according to the present disclosure or the like, the second compound semiconductor layer has a superlattice structure in which a p-type GaN layer and a p-type AlGaN layer are alternately laminated, and the thickness of the superlattice structure can be 0.7 μm or less. Employing such a superlattice structure makes it possible to reduce a series resistance component of the semiconductor light emitting element while maintaining a refractive index necessary for a cladding layer. This leads to achievement of a lower operating voltage of the semiconductor light emitting element. A lower limit value of the thickness of the superlattice structure can be, without being limited to, for example, 0.3 μm. The thickness of the p-type GaN layer constituting the superlattice structure can be, for example, 1 to 5 nm. The thickness of the p-type AlGaN layer constituting the superlattice structure can be, for example, 1 to 5 nm. A total number of p-type GaN layers and p-type AlGaN layers can be, for example, 60 to 300. In addition, a distance from the third compound semiconductor layer to the second electrode can be 1 μm or less, preferably 0.6 μm or less. By thus defining the distance from the third compound semiconductor layer to the second electrode, it is possible to reduce the thickness of the p-type second compound semiconductor layer having a high resistance, and consequently achieve a reduction in operating voltage of the semiconductor light emitting element. A lower limit value of the distance from the third compound semiconductor layer to the second electrode can be, without being limited to, for example, 0.3 μm. In addition, the second compound semiconductor layer is doped with $1\times10^{19}$ $cm^{-3}$ or more of Mg, and the absorption coefficient of the second compound semiconductor layer for light having a wavelength of 405 nm from the third compound semiconductor layer can be at least 50 $cm^1$. This atomic concentration of Mg is derived from a material property of exhibiting a maximum hole concentration at a value of $2\times10^{19}$ $cm^{-3}$, and is a result of being designed so as to achieve a maximum hole concentration, that is, minimize the specific resistance of the second compound semiconductor layer. The absorption coefficient of the second compound semiconductor layer is defined from a viewpoint of minimizing the resistance of the semiconductor light emitting element, and as a result, the absorption coefficient for the light of the third compound semiconductor layer is generally 50 $cm^1$. However, a doping amount of Mg can also be intentionally set to a concentration of $2\times10^{19}$ $cm^{-3}$ or more to increase the absorption coefficient. In this case, an upper limit of the doping amount of Mg when a practical hole concentration is obtained is, for example, $8\times10^{19}$ $cm^{-3}$. In addition, the second compound semiconductor layer includes, from the third compound semiconductor layer side, a non-doped compound semiconductor layer and a p-type compound semiconductor layer, and a distance from the third compound semiconductor layer to the p-type compound semiconductor layer can be $1.2\times10^{-7}$ m or less. By thus defining the distance from the third compound semiconductor layer to the p-type compound semiconductor layer, it is possible to suppress an internal loss within a range where internal quantum efficiency is not decreased, and thereby possible to reduce a threshold current density at which oscillation is started. A lower limit value of the distance from the third compound semiconductor layer to the p-type compound semiconductor layer can be, without being limited to, for example, $5\times10^{-8}$ m. In addition, a laminated insulating film constituted of a $SiO_2$/Si laminated structure is formed on both side surfaces of the ridge stripe structure, and a difference between the effective refractive index of the ridge stripe structure and the effective refractive index of the laminated insulating film can be $5\times10^{-3}$ to $1\times10^{-2}$. The use of such a laminated insulating film makes it possible to maintain a single fundamental lateral mode even in operation with a high power exceeding 100 milliwatts. In addition, the second compound semiconductor layer can be of a structure formed by laminating, from the third compound semiconductor layer side, for example, a non-doped InGaN layer (p-side light guide layer), a Mg-doped AlGaN layer (electronic barrier layer), a superlattice structure of GaN layer (Mg-doped)/AlGaN layer (superlattice cladding layer), and a Mg-doped GaN layer (p-side contact layer). The band gap of a compound semiconductor constituting the well layer in the third compound semiconductor layer is preferably 2.4 eV or more. In addition, it is desirable that the wavelength of light emitted from the third compound semiconductor layer (active layer) be 360 to 500 nm, preferably 400 to 410 nm. Here, it is needless to say that the various kinds of configurations described above can be combined with each other as appropriate.

In the semiconductor light emitting element according to the present disclosure or the like, various kinds of GaN-based compound semiconductor layers constituting the semiconductor light emitting element are sequentially formed on the substrate or the base. Here, the substrate or the base includes not only a sapphire substrate but also a GaAs substrate, a GaN substrate, a SiC substrate, an alumina substrate, a ZnS substrate, a ZnO substrate, an AlN substrate, a LiMgO substrate, a $LiGaO_2$ substrate, a $MgAl_2O_4$ substrate, an InP substrate, a Si substrate, and substrates obtained by forming an underlayer or a buffer layer on the surfaces (principal surfaces) of these substrates. Mainly in cases where a GaN-based compound semiconductor layer is formed on the substrate or the base, a GaN substrate is preferred because of a low defect density thereof. However, it is known that the GaN substrate changes between polar/nonpolar/semipolar characteristics, depending on a growth surface. In addition, methods of forming various kinds of compound semiconductor layers (for example, GaN-based compound semiconductor layers) constituting the semiconductor light emitting element according to the present disclosure or the like include a metal-organic chemical vapor deposition (MOCVD) method or a metal-organic vapor phase epitaxy (MOVPE) method, a molecular beam epitaxy (MBE) method, a hydride vapor deposition method in which halogen contributes to transport or reaction, and the like.

Here, when GaN-based compound semiconductor layers are formed as compound semiconductor layers, organic gallium source gases in the MOCVD method include a trimethylgallium (TMG) gas and a triethylgallium (TEG) gas, and nitrogen source gases include an ammonia gas and a hydrazine gas. In addition, in forming a GaN-based compound semiconductor layer having an n-type as a conductivity type thereof, it suffices, for example, to add silicon (Si) as an n-type impurity (n-type dopant), and in forming a GaN-based compound semiconductor layer having a p-type as a conductivity type thereof, it suffices, for example, to add magnesium (Mg) as a p-type impurity (p-type dopant). In addition, in a case where aluminum (Al) or indium (In) is included as constituent atoms of a GaN-based compound semiconductor layer, it suffices to use a trimethylaluminum (TMA) gas as an Al source, or it suffices to use a trimethylindium (TMI) gas as an In source. Further, it suffices to use a monosilane gas (SiH$_4$ gas) as a Si source, and it suffices to use a cyclopentadienyl magnesium gas, methylcyclopentadienyl magnesium, or biscyclopentadienyl magnesium (Cp$_2$Mg) as a Mg source. n-type impurities (n-type dopants) include not only Si but also Ge, Se, Sn, C, Te, S, O, Pd, and Po. p-type impurities (p-type dopants) include not only Mg but also Zn, Cd, Be, Ca, Ba, C, Hg, and Sr.

When the first conductivity type is the n-type, the first electrode electrically connected to the first compound semiconductor layer having the n-type as a conductivity type thereof preferably has a single-layer configuration or a multilayer configuration including at least one kind of metal selected from a group including gold (Au), silver (Ag), palladium (Pd), Al (aluminum), Ti (titanium), tungsten (W), Cu (copper), Zn (zinc), tin (Sn), and indium (In), and can, for example, be Ti/Au, Ti/Al, or Ti/Pt/Au. The first electrode is electrically connected to the first compound semiconductor layer in forms including a form in which the first electrode is formed on the first compound semiconductor layer and a form in which the first electrode is connected to the first compound semiconductor layer via a conductive material layer or a conductive substrate or base. The film formation of the first electrode and the second electrode can, for example, be performed by various kinds of physical vapor deposition (PVD) methods such as a vacuum deposition method, a sputtering method, and the like.

A pad electrode for electric connection to an external electrode or circuit may be provided on the first electrode and the second electrode. The pad electrode preferably has a single-layer configuration or a multilayer configuration including at least one kind of metal selected from a group including Ti (titanium), aluminum (Al), Pt (platinum), Au (gold), and Ni (nickel). Alternatively, the pad electrode can be a multilayer configuration exemplified by a multilayer configuration of Ti/Pt/Au and a multilayer configuration of Ti/Au.

In the mode-locked semiconductor laser element of the first configuration or the second configuration, a configuration is preferably adopted in which the reverse bias voltage V$_{sa}$ is applied between the first electrode and the second part, as described above (that is, a configuration in which the first electrode is a positive electrode, and the second part is a negative electrode). Incidentally, a pulse current or a pulse voltage synchronized with a pulse current or a pulse voltage applied to the first part of the second electrode may be applied to the second part of the second electrode, or a direct-current bias may be applied to the second part of the second electrode. In addition, a current can be fed from the second electrode to the first electrode via the light emitting region, and an external electric signal can be superimposed onto the first electrode from the second electrode via the light emitting region. Then, synchronization between laser light and the external electric signal can be thereby achieved. Alternatively, an optical signal can be made incident from one end surface of the laminated structure. Then, synchronization between the laser light and the optical signal can also be thereby achieved. In addition, in the second compound semiconductor layer, a non-doped compound semiconductor layer (for example, a non-doped InGaN layer or a non-doped AlGaN layer) may be formed between the third compound semiconductor layer and the electronic barrier layer. Further, a non-doped InGaN layer as a light guide layer may be formed between the third compound semiconductor layer and the non-doped compound semiconductor layer. A structure can also be adopted in which a Mg-doped GaN layer (p-side contact layer) occupies a top layer of the second compound semiconductor layer. The electronic barrier layer, the non-doped compound semiconductor layer, the light guide layer, and the p-side contact layer constitute the second compound semiconductor layer.

The mode-locked semiconductor laser element is not limited to a bisection type (two-electrode type) semiconductor laser element, but also the following can be employed as the mode-locked semiconductor laser element: a multisection type (multi-electrode type) semiconductor laser element, a saturable absorber layer (SAL) type semiconductor laser element in which a light emitting region and a saturable absorption region are arranged in a vertical direction, and a weakly index guide (WI) type semiconductor laser element in which a saturable absorption region is disposed along a ridge stripe structure.

In the semiconductor optical amplifier, the laminated structure can be specifically formed of an AlInGaN-based compound semiconductor. The configuration and structure of the semiconductor optical amplifier can be essentially similar to the configuration and structure of the semiconductor light emitting element except that the second electrode in the configuration and structure of the semiconductor optical amplifier is not divided.

The semiconductor light emitting element assembly according to the present disclosure is applicable to fields such, for example, as optical disk systems, a communication field, an optical information field, optoelectronic integrated circuits, a field in which nonlinear optical phenomena are applied, optical switches, a laser measurement field, various analysis fields, an ultrafast spectroscopy field, a multiphoton excitation spectroscopy field, a mass spectrometry field, a field of microspectroscopy using multiphoton absorption, quantum control of chemical reaction, a nano three-dimensional processing field, various processing fields in which multiphoton absorption is applied, a medical field, a bioimaging field, a quantum information communication field, and a quantum information processing field.

First Embodiment

Figure 2:
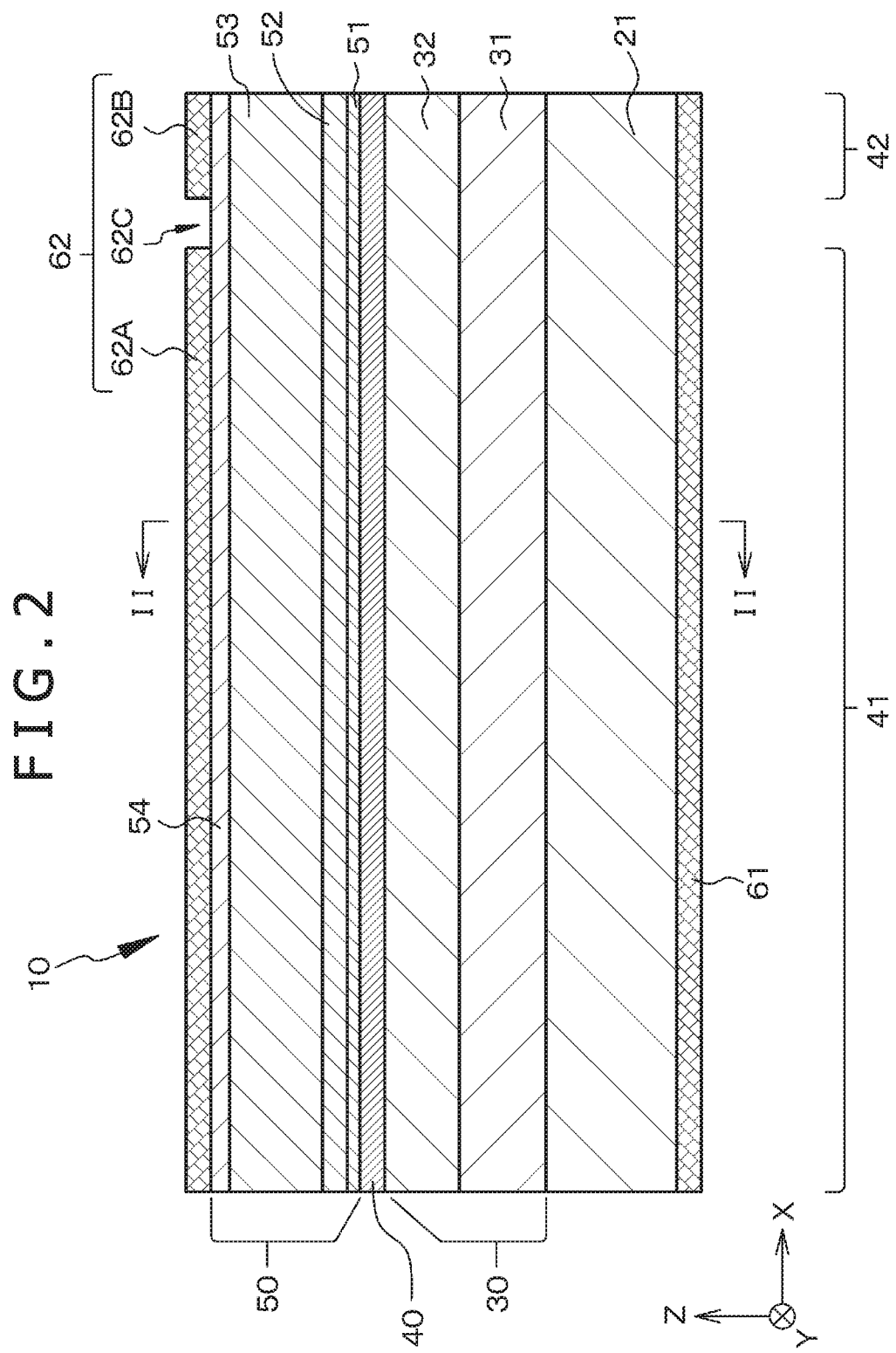
FIG. 2 is a schematic end view of a semiconductor light emitting element (semiconductor laser element) in the first embodiment, the schematic end view being taken along an extending direction of a resonator.
Figure 3:
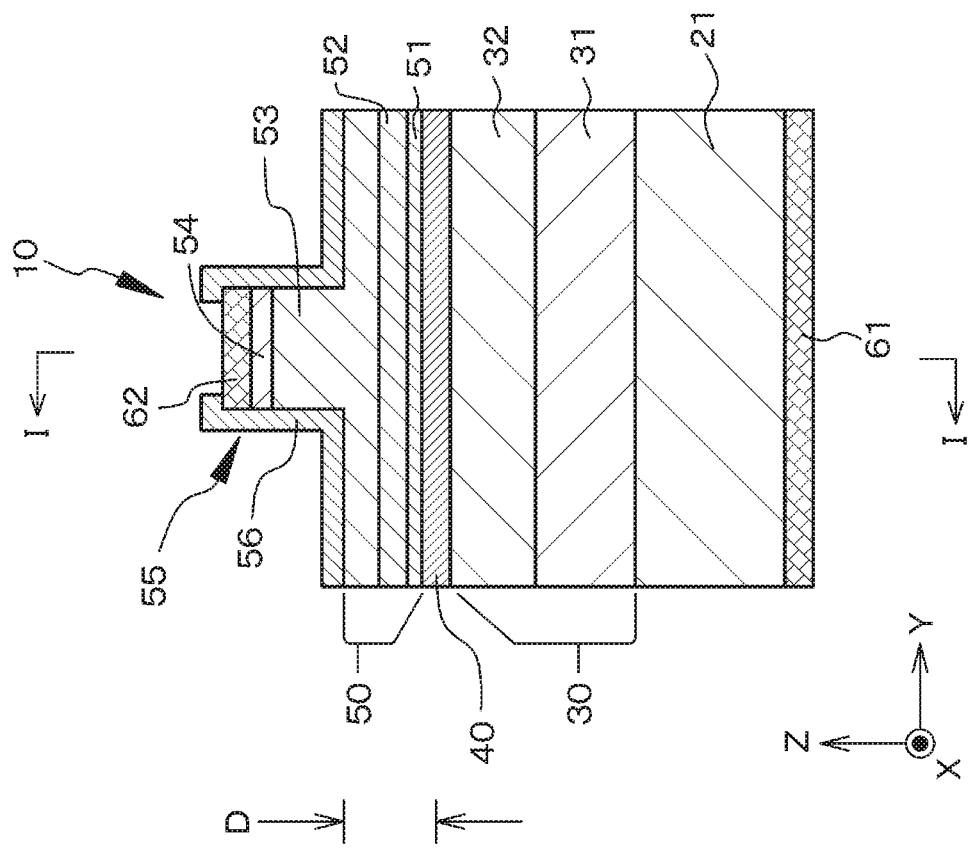
FIG. 3 is a schematic sectional view of the semiconductor light emitting element (semiconductor laser element) in the first embodiment, the schematic sectional view being taken along a direction at a right angle to the extending direction of the resonator.
Figure 4:
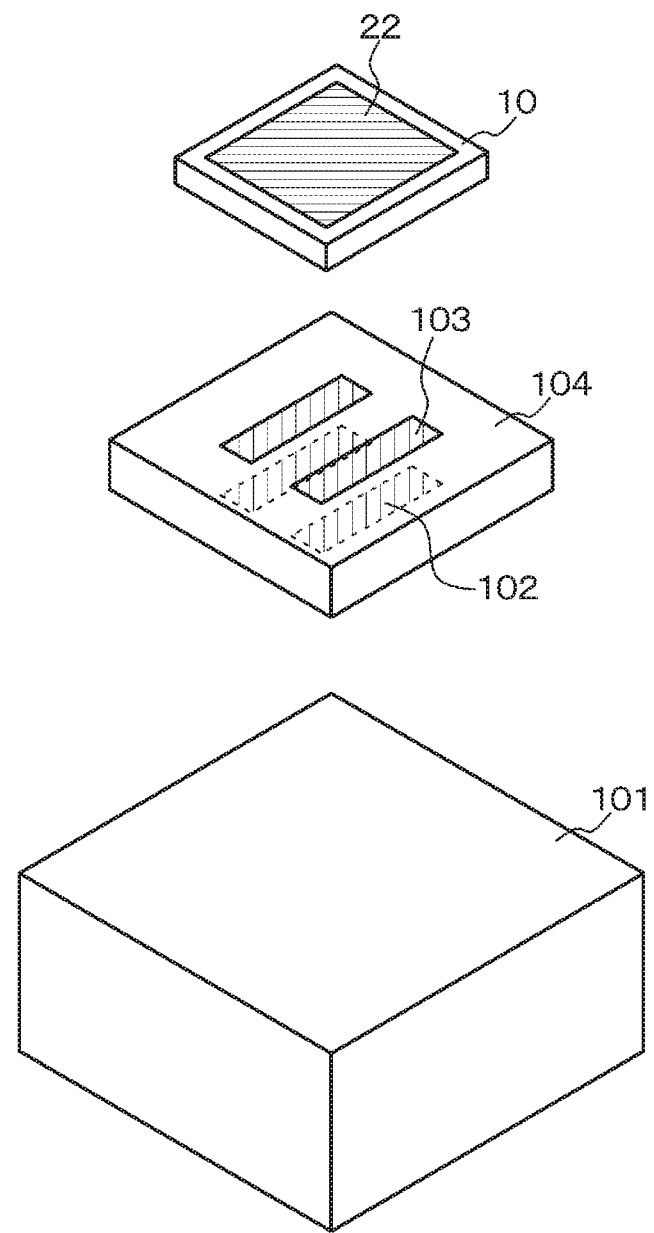
FIG. 4 is a conceptual perspective view when a semiconductor light emitting element assembly according to the first embodiment is disassembled.

A first embodiment relates to the semiconductor light emitting elements according to the first mode and the second mode of the present disclosure and the semiconductor light emitting element assemblies according to the first mode and the second mode of the present disclosure. FIG. 1A is a conceptual diagram of a semiconductor light emitting element according to the first embodiment. FIG. 2 is a schematic end view of the semiconductor light emitting element (which is specifically a semiconductor laser element, and will be referred to as a "semiconductor laser element 10" in the following description), the end view being taken along an extending direction of a resonator (that is, along arrows I-I in FIG. 3). FIG. 3 is a schematic sectional view of the semiconductor laser element 10, the sectional view being taken along a direction at a right angle to the extending direction of the resonator (that is, along arrows II-II in FIG. 2). In addition, FIG. 4 is a conceptual perspective view when a semiconductor light emitting element assembly according to the first embodiment is disassembled.

The semiconductor laser element 10 in the first embodiment or a second embodiment or a third embodiment to be described later has a laminated structure in which a first compound semiconductor layer 30, an active layer 40, and a second compound semiconductor layer 50 are laminated. In addition, the semiconductor light emitting element assembly in the first embodiment, or the second embodiment or the third embodiment to be described later includes a semiconductor light emitting element (specifically the semiconductor laser element 10) having the laminated structure in which the first compound semiconductor layer 30, the active layer 40, and the second compound semiconductor layer 50 are laminated.

The laminated structure has a structure in which a light emitting region 41 and a saturable absorption region 42 are juxtaposed to each other in a resonator direction. Then, the saturable absorption region 42 is disposed in an end region of the laminated structure in the resonator direction. More specifically, the semiconductor laser element 10 in the first embodiment, or the second embodiment or the third embodiment to be described later is formed by a mode-locked semiconductor laser element having the light emitting region 41 and the saturable absorption region 42. The mode-locked semiconductor laser element is specifically formed by a mode-locked semiconductor laser element of a bisection type with a light emission wavelength in a 405-nm band, and includes the following:

a laminated structure formed by sequentially laminating, on a base, a first compound semiconductor layer 30 formed of a GaN-based compound semiconductor and having a first conductivity type (n-conductivity type in the embodiment), a third compound semiconductor layer (active layer) 40 formed of a GaN-based compound semiconductor, and a second compound semiconductor layer 50 formed of a GaN-based compound semiconductor and having a second conductivity type (p-conductivity type in the embodiment) different from the first conductivity type;

a second electrode 62 formed on the second compound semiconductor layer 50; and a first electrode 61 electrically connected to the first compound semiconductor layer 30.

The first compound semiconductor layer 30 is formed on the base (specifically a substrate 21). In addition, the mode-locked semiconductor laser element in the first embodiment, or the second embodiment or the third embodiment to be described later is more specifically a mode-locked semiconductor laser element of a current injection type and with passive mode locking, the mode-locked semiconductor laser element having a peak-power light density of $1 \times 10^{10}$ watts/cm$^2$ or more, preferably $1.4 \times 10^{10}$ watts/cm$^2$ or more, and a carrier density of $1 \times 10^{19}$/cm$^3$ or more, and is a mode-locked semiconductor laser element of the first configuration or the second configuration.

The second electrode 62 is divided, by a dividing groove 62C, into a first part 62A for producing a forward bias state by feeding a direct current to the first electrode 61 via the light emitting region (gain region) 41 and a second part 62B for applying an electric field to the saturable absorption region 42 (second part 62B for applying a reverse bias voltage $V_{sa}$ to the saturable absorption region 42). Here, an electric resistance value between the first part 62A and the second part 62B of the second electrode 62 (which electric resistance value may be referred to as a "division resistance value") is equal to or more than $1 \times 10$ times an electric resistance value between the second electrode 62 and the first electrode 61, specifically $1.5 \times 10^3$ times the electric resistance value between the second electrode 62 and the first electrode 61. In addition, the electric resistance value (division resistance value) between the first part 62A and the second part 62B of the second electrode 62 is $1 \times 10^2 \Omega$ or more, specifically $1.5 \times 10^4 \Omega$. The resonator length of the semiconductor laser element 10 was set at 600 μm, and the lengths of the first part 62A, the second part 62B, and the dividing groove 62C of the second electrode 62 were set at 560 μm, 30 μm, and 10 μm, respectively.

The semiconductor laser element 10 in the first embodiment, or the second embodiment or the third embodiment to be described later is specifically a semiconductor laser element having a ridge stripe type separate confinement heterostructure (SCH). More specifically, the semiconductor laser element 10 is an index guide type GaN-based semiconductor laser element formed of AlInGaN, and has a ridge stripe structure 55. The width of the ridge stripe structure 55 was set at 1.4 μm. The ridge stripe structure 55 is curved toward a light emitting end surface (second end surface) to reduce end surface reflection, but is not limited to such a shape. The ridge stripe structure 55 is orthogonal to a light reflecting end surface (first end surface).

The first compound semiconductor layer 30, the third compound semiconductor layer (active layer) 40, and the second compound semiconductor layer 50 are specifically formed of an AlInGaN-based compound semiconductor, and more specifically have a layer configuration illustrated in the following Table 1. Here, the lower a position at which a compound semiconductor layer is entered in Table 1 is, the closer to the n-type GaN substrate 21 the layer is. The band gap of a compound semiconductor constituting a well layer in the third compound semiconductor layer 40 is 3.06 eV. The semiconductor laser element 10 in the first embodiment, or the second embodiment or the third embodiment to be described later is disposed on the (0001) plane of the n-type GaN substrate 21, and the third compound semiconductor layer 40 has a quantum well structure. The (0001) plane of the n-type GaN substrate 21 is referred to also as a "C-plane," and is a crystal plane having polarity.

TABLE 1

Second compound semiconductor layer 50
p-type GaN contact layer (Mg-doped) 54
p-type GaN (Mg-doped)/AlGaN superlattice cladding layer 53
p-type AlGaN electronic barrier layer (Mg-doped) 52
Non-doped InGaN light guide layer 51
Third compound semiconductor layer 40
InGaN quantum well active layer
(well layer: $In_{0.08}Ga_{0.92}N$/barrier layer: $In_{0.02}Ga_{0.98}N$)
First compound semiconductor layer 30
n-type GaN cladding layer 32
n-type AlGaN cladding layer 31
where
Well layer (two layers) 8 nm non-doped
Barrier layer (three layers) 14 nm doped with Si In addition, part of the p-type GaN contact layer 54 and the p-type GaN/AlGaN superlattice cladding layer 53 are removed by an reactive ion etching (RIE) method, so that the ridge stripe structure 55 is formed. A laminated insulating film 56 formed of SiO$_2$/Si is formed on both sides of the ridge stripe structure 55. Incidentally, the SiO$_2$ layer is a lower layer, and the Si layer is an upper layer. Here, a difference between the effective refractive index of the ridge stripe structure 55 and the effective refractive index of the laminated insulating film 56 is $5 \times 10^{-3}$ to $1 \times 10^{-2}$, specifically $7 \times 10^{-3}$. In addition, the second electrode (p-side ohmic electrode) 62 is formed on the p-type GaN contact layer 54 corresponding to a top surface of the ridge stripe structure 55. On the other hand, the first electrode (n-side ohmic electrode) 61 formed of Ti/Pt/Au is formed on the undersurface of the n-type GaN substrate 21.

In the semiconductor laser element 10 in the first embodiment, or the second embodiment or the third embodiment to be described later, an antireflection coat layer (AR) is formed on the light emitting end surface (second end surface) opposed to collimating means 11. On the other hand, a high-reflection coat layer (HR) is formed on the light reflecting end surface (first end surface) opposed to the light emitting end surface (second end surface) in the semiconductor laser element 10. The saturable absorption region 42 is disposed on the side of the first end surface in the semiconductor laser element 10. A laminated structure of at least two kinds of layers selected from a group including a titanium oxide layer, a tantalum oxide layer, a zirconium oxide layer, a silicon oxide layer, and an aluminum oxide layer can be cited as the antireflection coat layer (low-reflection coat layer).

The pulse repetition frequency of the semiconductor laser element 10 in the first embodiment, or the second embodiment or the third embodiment to be described later was set at 1 GHz. The repetition frequency of laser light of the semiconductor laser element 10 is preferably 1 GHz or less. Incidentally, an optical pulse (optical pulse train) repetition frequency f is determined by an external resonator length X' (distance between the first end surface and an optical member 12) and the length L of the resonator, and is expressed by the following equation.

$$f=c/\{2(X'+L(n-1))\}$$

where c is the speed of light, and n is the effective refractive index of the resonator.

Incidentally, as described above, it is preferable to form the second electrode 62 having a division resistance value of $1\times10^2 \Omega$ or more on the second compound semiconductor layer 50. In the case of the GaN-based semiconductor laser element, unlike a conventional GaAs-based semiconductor laser element, mobility in the compound semiconductor having the p-conductivity type is low. Therefore, the electric resistance value between the first part 62A and the second part 62B of the second electrode 62 can be made equal to or more than 10 times the electric resistance value between the second electrode 62 and the first electrode 61, or the electric resistance value between the first part 62A and the second part 62B of the second electrode 62 can be made equal to or more than $1\times10^2 \Omega$, by dividing the second electrode 62 formed on the second compound semiconductor layer 50 by the dividing groove 62C without increasing the resistance of the second compound semiconductor layer 50 having the p-conductivity type by ion implantation or the like.

Here, characteristics desired for the second electrode 62 are as follows. That is,
(1) The second electrode 62 has a function of an etching mask when the second compound semiconductor layer 50 is etched.
(2) The second electrode 62 can be wet etched without the optical and electrical characteristics of the second compound semiconductor layer 50 being degraded.
(3) The second electrode 62 exhibits a contact resistivity value equal to or less than $10^{-2}$ $\Omega \cdot cm^2$ when the film formation thereof is performed on the second compound semiconductor layer 50.
(4) When the second electrode 62 has a laminated structure, a material for forming a lower metal layer has a large work function, exhibits a low contact resistivity value with respect to the second compound semiconductor layer 50, and can be wet etched.
(5) When the second electrode 62 has a laminated structure, a material for forming an upper metal layer is resistant to etching (for example, a $Cl_2$ gas used in the RIE method) when the ridge stripe structure is formed, and can be wet etched.

In the first embodiment, or the second embodiment or the third embodiment to be described later, the second electrode 62 was formed by a Pd single layer having a thickness of 0.1 µm.

The semiconductor light emitting element assembly in the first embodiment, or the second embodiment or the third embodiment to be described later is specifically constituted of the semiconductor laser element 10 and the optical member 12. Then, light emitted from the second end surface (light emitting surface) of the semiconductor laser element 10 collides with the optical member 12, a part of the light is returned to the semiconductor laser element 10, and the remaining light is reflected by a reflecting mirror 13 and emitted to the outside through an optical isolator 14. The optical isolator 14 is disposed to prevent return light from going to the semiconductor laser element 10. The first end surface (light reflecting surface) of the semiconductor laser element 10 and the optical member 12 constitute an external resonator structure. The distance of an optical system is the length of the external resonator structure. The optical member 12 is formed by a diffraction grating on which uneven portions or groove portions in a lattice form are formed, and has a Littrow arrangement (referred to also as a Littman arrangement). The optical member 12 returns, to the semiconductor laser element 10, first-order diffracted light of light emitted from the semiconductor laser element 10, and emits, to the outside, zeroth-order diffracted light of the light emitted from the semiconductor laser element 10. The number of lines of a pattern in the lattice form in the diffraction grating was set at 2400 lines/mm. The collimating means (specifically a lens 11) for converting the laser light from the semiconductor laser element 10 into a collimated light beam is disposed between the semiconductor laser element 10 and the optical member 12, and constitutes the external resonator structure of a collimating type.

The semiconductor light emitting element assembly in the first embodiment, or the second embodiment or the third embodiment to be described later further includes a heat sink 101 and a sub-mount 104. The heat sink 101, the sub-mount 104, and the semiconductor laser element 10 are sequentially laminated. The heat sink 101 is formed of, for example, Cu, Fe, Au, or the like, and is controlled in temperature by a Peltier element not depicted in the figures. The sub-mount 104 is formed of AlN ceramic, for example, and has a thermal conductivity of 230 W/K·m. The heat sink 101 and the sub-mount 104 are laminated via a first soldering layer 102, and the sub-mount 104 and the semiconductor laser element 10 are laminated via a second soldering layer 103. Incidentally, in FIG. 4, the second soldering layer 103 formed on a surface of the sub-mount 104 which surface is on the semiconductor laser element 10 side is hatched to be illustrated clearly, and the first soldering layer 102 formed on a surface of the sub-mount 104 which surface is on the heat sink 101 side is indicated by dotted lines. Reference numeral 22 denotes a pad electrode provided to the semiconductor laser element 10, the pad electrode being hatched to be illustrated clearly.

In a case where the area of the first soldering layer 102 relative to the area of the sub-mount 104 and the area of the second soldering layer 103 relative to the area of the sub-mount 104 were set at "1," the semiconductor laser element 10 was operated so as to provide a maximum optical output (that is, a current fed to the light emitting region 41 was $I_0$ amperes/$cm^2$ per unit area of the light emitting region 41), and no temperature control was performed by the heat sink 101, the temperature of the heat sink 101 at room temperature of 25° C. was 40° C. or lower. On the other hand, when the area of the first soldering layer 102 relative to the area of the sub-mount 104 and the area of the second soldering layer 103 relative to the area of the sub-mount 104 were set as described above, and the current fed to the light emitting region 41 was $I_0$ amperes/cm² per unit area of the light emitting region 41, the temperature of the heat sink 101 at the room temperature of 25° C. was 55° C. even when no temperature control was performed by the heat sink 101. That is, such a configuration can more reduce heat generated in the semiconductor laser element 10 and transmitted to the heat sink 101, and can thus provide a so-called thermal storage structure.

The following relation holds between the temperature $T_{act}$ of the active layer (third compound semiconductor layer) 40 and the temperature $T_{hs}$ of the heat sink 101:

$$T_{act} = T_{hs} + R_{th} \times P_{1n}$$

where $R_{th}$ (K/W) is the thermal resistance of the semiconductor laser element 10, and $P_{1n}$ (W) is input power. Here, $P_{1n}$ is substantially equal at a same operating current value, and thus the temperature $T_{act}$ of the active layer changes in a similar manner to the temperature $T_{hs}$ of the heat sink 101. Relation between the temperature $T_{act}$ of the active layer (third compound semiconductor layer) 40 and the temperature $T_{hs}$ of the heat sink 101 can be obtained by performing various experiments. In the following description, the temperature $T_{hs}$ of the heat sink 101 will be used in place of the temperature $T_{act}$ of the active layer (third compound semiconductor layer) 40.

Figure 5:
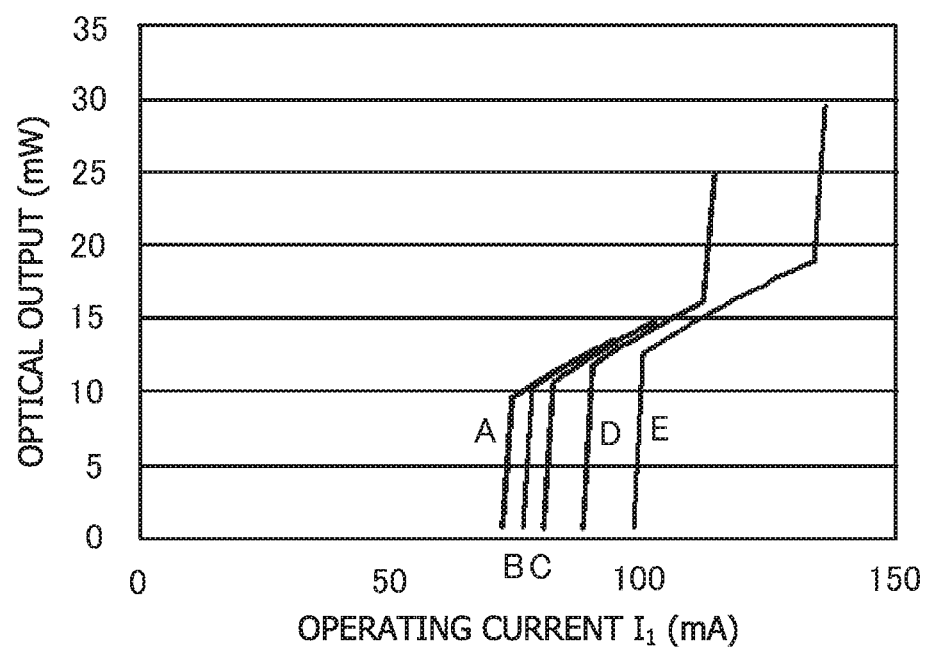
FIG. 5 is a graph depicting a result of obtaining relation between operating current $I_1$ and optical output in the semiconductor light emitting element according to the first embodiment.

FIG. 5 depicts a result of obtaining optical output (unit: milliwatt) when the temperature $T_{hs}$ of the heat sink 101 was controlled by a Peltier element in the semiconductor light emitting element assembly according to the first embodiment, a current (operating current) $I_1$ (unit: milliampere) was fed between the first part 62A of the second electrode 62 and the first electrode 61, and a reverse bias voltage $V_{sa}$ (=7.5 volts) was applied between the second part 62B of the second electrode 62 and the first electrode 61. Incidentally, in FIG. 5, "A" indicates data when $T_{hs}$=20° C., "B" indicates data when $T_{hs}$=30° C., "C" indicates data when $T_{hs}$=40° C., "D" indicates data when $T_{hs}$=50° C., and "E" indicates data when $T_{hs}$=60° C. When the operating current $I_1$ is increased, laser oscillation occurs. The value of the operating current at that time will be referred to as a lower limit value (oscillation threshold current) $I_{min}$ of an operating current range. When the operating current $I_1$ is then further increased, the optical output increases linearly. When an upper limit value $I_{max}$ of the operating current range is exceeded, the optical output of laser light emitted from the semiconductor laser element 10 increases sharply. Here, the operating current when the optical pulse repetition frequency f changes from a fundamental frequency determined by the distance of the optical system (the length of the external resonator structure) to a frequency twice the fundamental frequency is the upper limit value $I_{max}$ of the operating current range. When $T_{hs}$=70° C., the phenomenon in which the optical output of the laser light emitted from the semiconductor laser element 10 increases sharply when the upper limit value $I_{max}$ is exceeded occurred immediately after the operating current started to be fed, and stable laser oscillation was not possible.

Figure 6A:
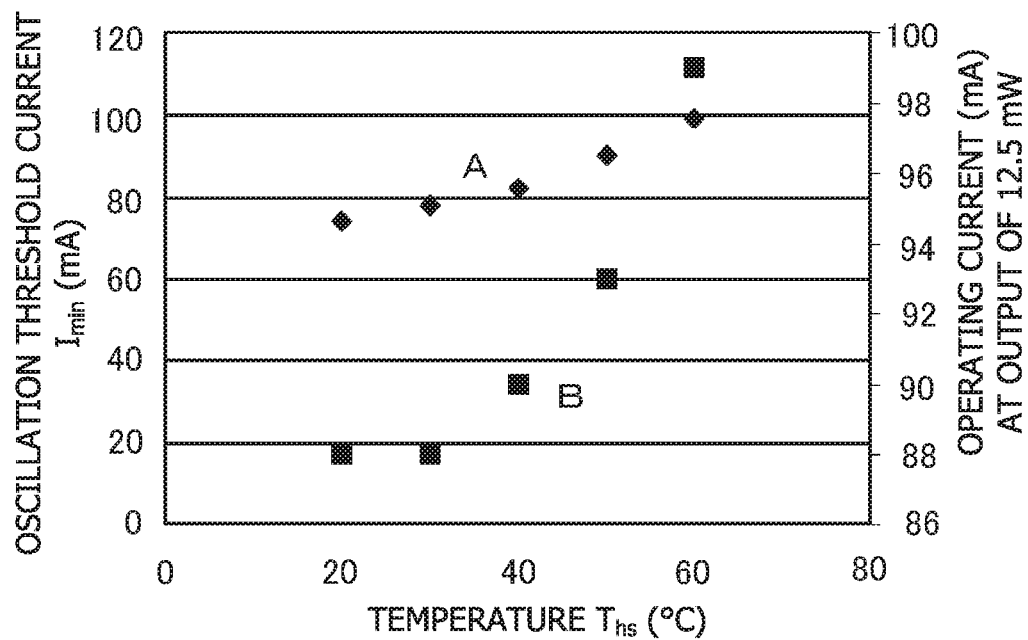
FIG. 6A is a graph depicting, on the basis of the result depicted in FIG. 5, a result of obtaining relation between the temperature $T_{hs}$ of a heat sink and a lower limit value (oscillation threshold current) $I_{min}$ of an operating current range and the value of operating current when an optical output of 12.5 milliwatts is obtained.

In addition, on the basis of the result depicted in FIG. 5, FIG. 6A depicts a result of obtaining relation between the temperature $T_{hs}$ of the heat sink 101 and the lower limit value (oscillation threshold current) $I_{min}$ of the operating current range (see black rhombic marks of "A" in FIG. 6A) and the value of the operating current when an optical output of 12.5 milliwatts is obtained (see black square marks of "B" in FIG. 6A). Rises in the lower limit value (oscillation threshold current) $I_{min}$ of the operating current range are a phenomenon occurring as a result of rises in the temperature of the active layer (third compound semiconductor layer 40) due to rises in the temperature $T_{hs}$ of the heat sink 101, and exhibit a tendency similar to that of a conventional semiconductor laser element. For similar reasons, comparison between operating currents when the optical output is 12.5 milliwatts confirms that the operating current increases due to rises in the temperature $T_{hs}$ of the heat sink 101. In other words, it is confirmed that at a certain same operating current, the optical output decreases due to rises in the temperature $T_{hs}$ of the heat sink 101.

Figure 15:
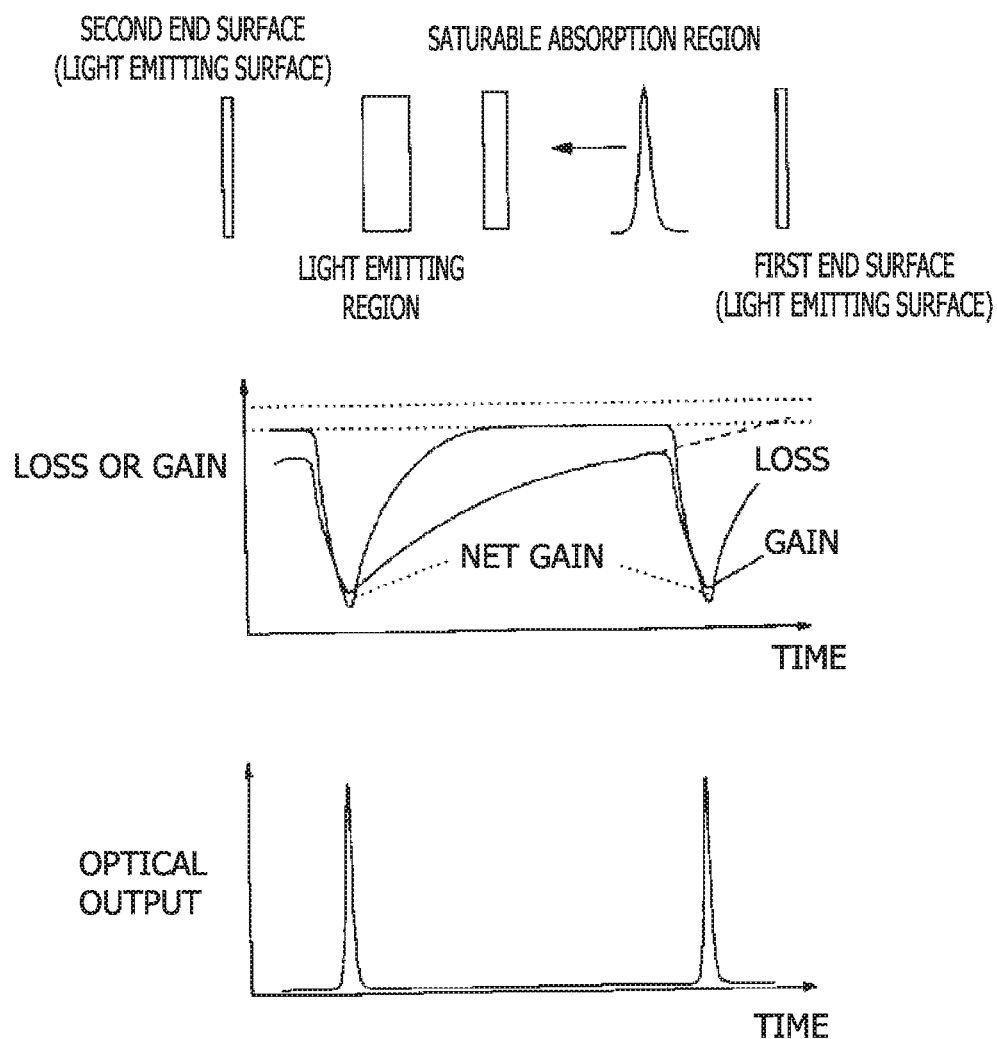
FIG. 15 is a diagram of assistance in explaining a phenomenon in which the optical output increases sharply when an upper limit value of the operating current range is exceeded.

Incidentally, the phenomenon in which the optical output increases sharply when the upper limit value $I_{max}$ of the operating current range is exceeded can be described as follows. As depicted in FIG. 15, the optical pulse repetition frequency f is determined by a time taken for light to make a round trip in the optical system. Within the round-trip time, absorption (loss) in the saturable absorption region 42 needs to exceed a gain in the gain region 41. Then, when the current injected into the gain region 41 is increased, the recovery time of the gain becomes earlier than a fundamental round-trip time, and optical pulses arriving in a round-trip time half the fundamental round-trip time can also obtain a gain. As a result, optical pulses occur in the time half the fundamental round-trip time, that is, at a frequency twice the fundamental frequency, rather than at the fundamental frequency determined by the fundamental round-trip time.

Figure 6B:
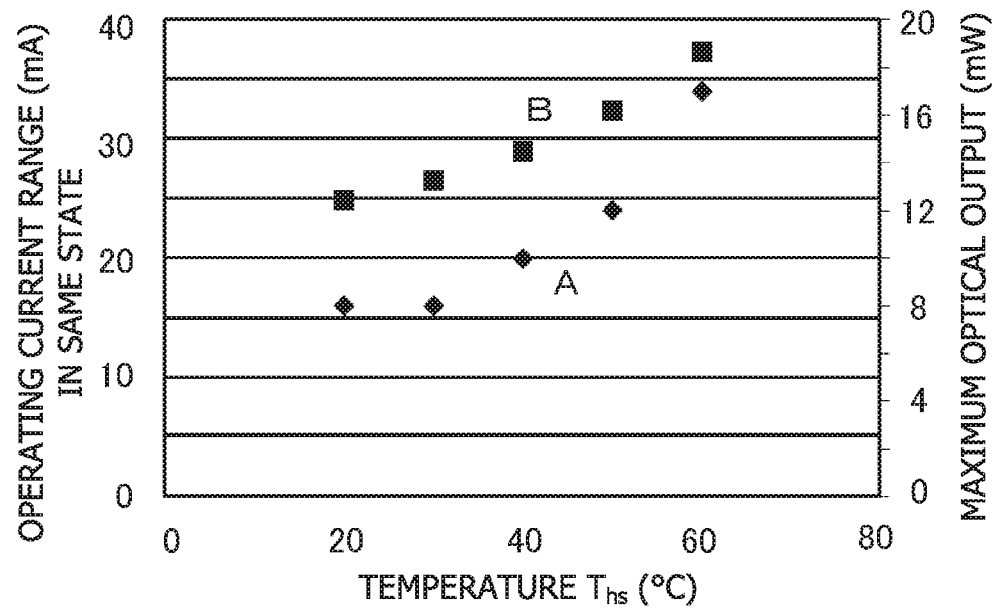
FIG. 6B is a graph depicting a result of comparing the temperature dependence measurement results depicted in FIG. 5 by the operating current range in a same pulse state and maximum optical output.
Figure 7A:
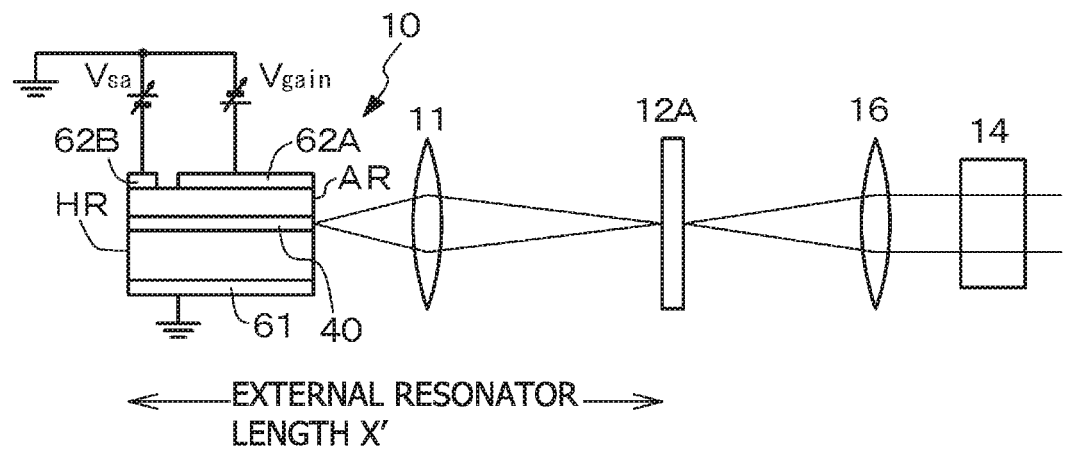
FIG. 7A and FIG. 7B are conceptual diagrams of modifications of the semiconductor light emitting element according to the first embodiment.
Figure 7B:
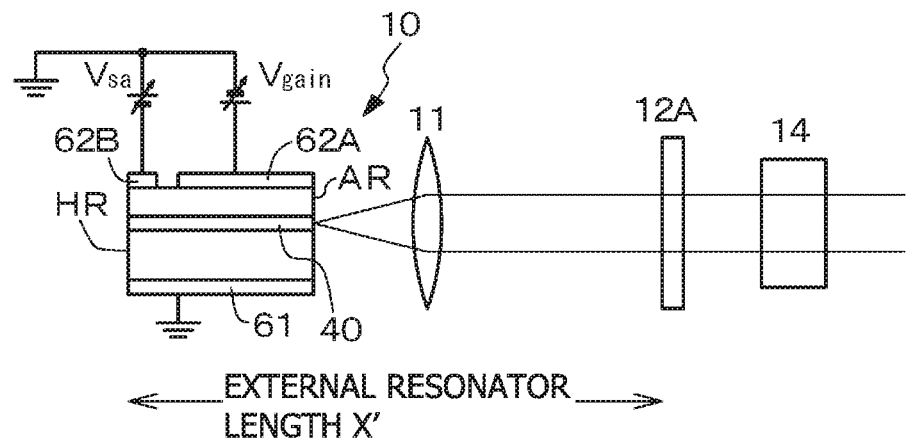

FIG. 6B depicts a result of comparing the temperature dependence measurement results depicted in FIG. 5 by the operating current range in a same pulse state (see black rhombic marks of "A" in FIG. 6B) and maximum optical output (see black square marks of "B" in FIG. 6B). A tendency was observed in which the higher the temperature $T_{hs}$ of the heat sink 101, the wider the operating current range for generating optical pulses in the same pulse state, and the higher the maximum optical output. That is, the following is satisfied:

$$\Delta I_2 > \Delta I_1$$

where $\Delta I_1$ is the operating current range when the temperature of the active layer is $T_1$, and $\Delta I_2$ is the operating current range when the temperature of the active layer is $T_2$ (where $T_2 > T_1$). As a factor in the increase in the operating current range, from FIG. 15, it may be considered that a differential gain is decreased and the recovery time of the gain becomes longer or that the saturation level of the saturable absorption region 42 is raised. However, because the output immediately after oscillation is improved, a rise in saturable absorption level is estimated to be the factor in this case. In addition, the following is satisfied:

$$I_{max-2} > I_{max-1}$$

where $I_{max-1}$ is the upper limit value of the operating current range when the temperature of the active layer is $T_1$, and $I_{max-2}$ is the upper limit value of the operating current range when the temperature of the active layer is $T_2$. Further, the following is satisfied:

$$P_2 > P_1$$

where $P_1$ is the maximum optical output emitted when the temperature of the active layer is $T_1$, and $P_2$ is the maximum optical output emitted when the temperature of the active layer is $T_2$ (where $T_2 > T_1$). In addition, the current fed to the light emitting region is preferably $1 \times 10^2$ amperes/cm² to 1×10⁵ amperes/cm² (specifically, for example, 1×10⁴ amperes/cm²) per unit area of the light emitting region.

Thus, in the semiconductor light emitting element according to the first embodiment, the relation $\Delta I_2 > \Delta I_1$ is satisfied. Therefore, the higher the temperature of the active layer, the wider the operating current range. As a result, the optical output can be increased. In addition, because $P_2 > P_1$ is satisfied, the higher the temperature of the active layer, the higher the maximum optical output. The optical output can therefore be increased. In addition, the optical output can be increased by setting the temperature of the active layer during operation (during light emission) to 50° C. or higher and lower than 70° C.

As described earlier, the temperature of the heat sink 101 at room temperature of 25° C. was 55° C. even when no temperature control was performed by the heat sink 101. However, as depicted in FIG. 5, the temperature of the active layer may preferably be higher than 55° C. Thus, in such a case, it is desirable to control the temperature of the active layer by the heat sink 101, specifically control (heat) the temperature of the active layer (third compound semiconductor layer 40) by heating the heat sink 101.

A method of manufacturing the mode-locked semiconductor laser element in the first embodiment, or the second embodiment or the third embodiment to be described later will be described in the following with reference to FIG. 12A, FIG. 12B, FIG. 13A, FIG. 13B, and FIG. 14. Incidentally, FIG. 12A, FIG. 12B, FIG. 13A, and FIG. 13B are schematic partial sectional views when the substrate and the like are sectioned in a YZ plane, and FIG. 14 is a schematic partial end view when the substrate and the like are sectioned in a XZ plane.

Process-100

Figure 12A:
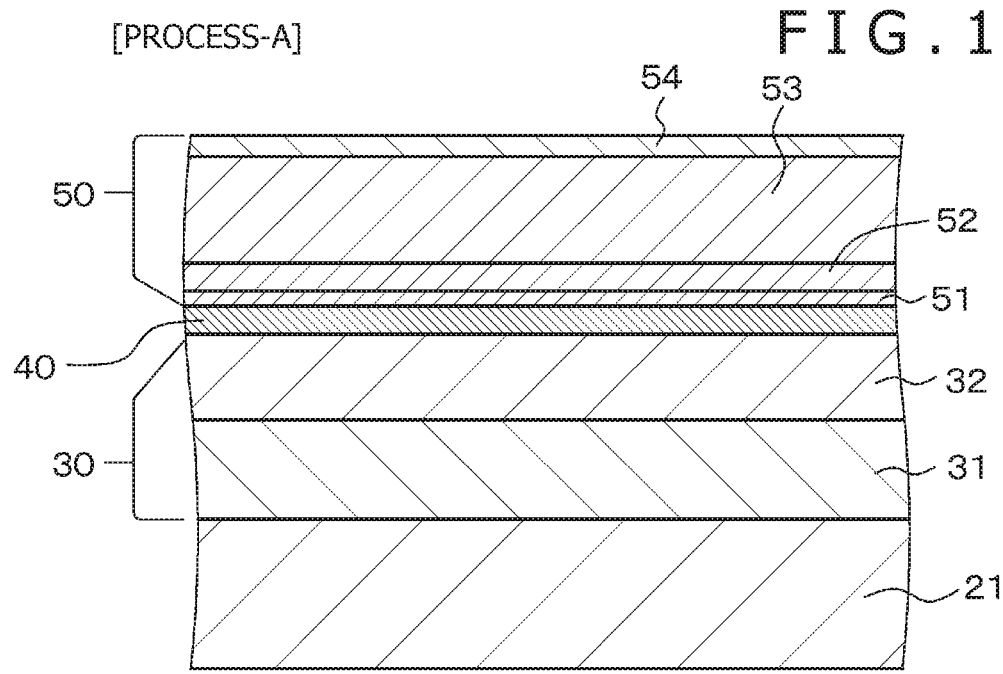
FIG. 12A and FIG. 12B are schematic partial sectional views of a substrate and the like, the schematic partial sectional views being of assistance in explaining a method of manufacturing the mode-locked semiconductor laser element according to the first embodiment.
Figure 12B:
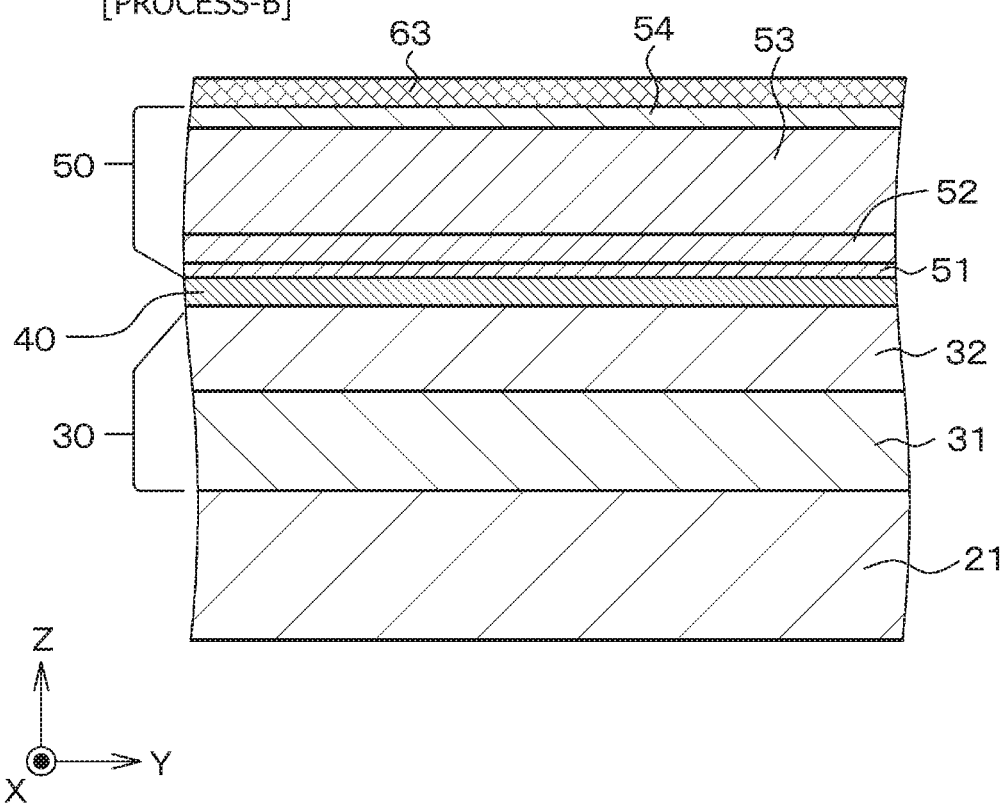
Figure 13A:
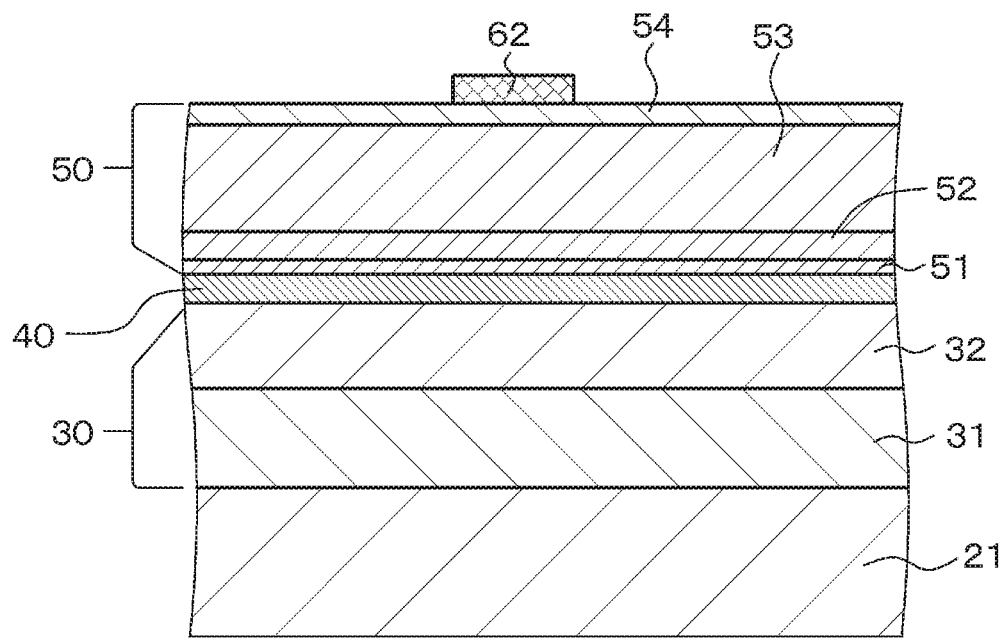
FIG. 13A and FIG. 13B, continued from FIG. 12B, are schematic partial sectional views of the substrate and the like, the schematic partial sectional views being of assistance in explaining the method of manufacturing the mode-locked semiconductor laser element according to the first embodiment.
Figure 13B:
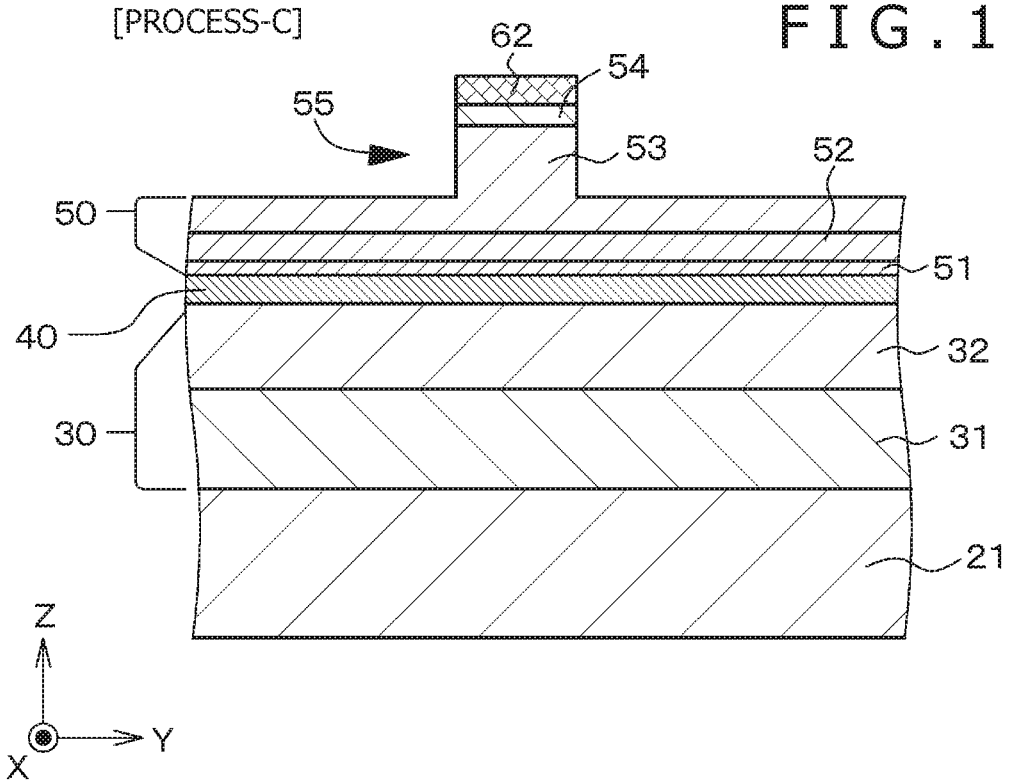

First, a laminated structure is formed on a base, specifically on the (0001) plane of an n-type GaN substrate 21 on the basis of a well-known MOCVD method, the laminated structure being formed by sequentially laminating a first compound semiconductor layer 30 having a first conductivity type (n-conductivity type) and formed of a GaN-based compound semiconductor, a third compound semiconductor layer (active layer) 40 formed of a GaN-based compound semiconductor and constituting a light emitting region (gain region) 41 and a saturable absorption region 42, and a second compound semiconductor layer 50 having a second conductivity type (p-conductivity type) different from the first conductivity type and formed of a GaN-based compound semiconductor (see FIG. 12A).

Process-110

Then, a second electrode 62 in a band shape is formed on the second compound semiconductor layer 50. Specifically, film formation of a Pd layer 63 is performed over the entire surface on the basis of a vacuum deposition method (see FIG. 12B), and thereafter an etching resist layer in a band shape is formed on the Pd layer 63 on the basis of photolithography technology. Then, the Pd layer 63 not covered by the etching resist layer is removed by using aqua regia, and thereafter the etching resist layer is removed. Thus, a structure depicted in FIG. 13A can be obtained. Incidentally, the second electrode 62 in a band shape may be formed on the second compound semiconductor layer 50 on the basis of a lift-off method.

Process-120

Next, a ridge stripe structure is formed by etching at least a part of the second compound semiconductor layer 50 (specifically, etching a part of the second compound semiconductor layer 50) with the second electrode 62 used as an etching mask. Specifically, a part of the second compound semiconductor layer 50 is etched by using the second electrode 62 as an etching mask on the basis of an RIE method using a $Cl_2$ gas. Thus, a structure depicted in FIG. 13B can be obtained. Because the ridge stripe structure is thus formed by a self-alignment system using, as an etching mask, the second electrode 62 patterned in a band shape, no misalignment occurs between the second electrode 62 and the ridge stripe structure.

Process-130

A resist layer 64 for forming a dividing groove in the second electrode 62 is thereafter formed (see FIG. 14). Incidentally, reference numeral 65 denotes an opening portion provided in the resist layer 64 to form the dividing groove. Next, a dividing groove 62C is formed in the second electrode 62 by a wet etching method with the resist layer 64 used as a wet etching mask. The second electrode 62 is thereby divided into a first part 62A and a second part 62B by the dividing groove 62C. Specifically, the dividing groove 62C is formed in the second electrode 62 by using aqua regia as an etchant, and immersing the whole body in the aqua regia for approximately 10 seconds. Then, the resist layer 64 is thereafter removed. Thus, a structure depicted in FIG. 2 and FIG. 3 can be obtained. Thus employing the wet etching method, unlike a dry etching method, does not cause a degradation in the optical and electrical characteristics of the second compound semiconductor layer 50. Accordingly, the light emission characteristics of the mode-locked semiconductor laser element are not degraded. Incidentally, employing a dry etching method may increase an internal loss $\alpha_1$ of the second compound semiconductor layer 50, raise a threshold voltage, and invite a decrease in the optical output. Here, $$ER_0/ER_1 \neq 1 \times 10^2$$

where $ER_0$ is the etching rate of the second electrode 62, and $ER_1$ is the etching rate of the laminated structure. Because high etching selectivity is thus present between the second electrode 62 and the second compound semiconductor layer 50, the second electrode 62 can be etched surely without the laminated structure being etched (or with the laminated structure etched slightly even if etched). Incidentally, it is desirable to satisfy $ER_0/ER_1 \geq 1 \times 10$, preferably $ER_0/ER_1 \geq 1 \times 10^2$.

The second electrode may be a laminated structure of a lower metal layer having a thickness of 20 nm and formed of palladium (Pd) and an upper metal layer having a thickness of 200 nm and formed of nickel (Ni). In this case, in wet etching using aqua regia, the etching rate of nickel is approximately 1.25 times the etching rate of palladium.

Process-140

Thereafter, the formation of a first electrode 61, the cleaving of the substrate 21, and the like are performed, and further packaging is performed. Thereby the semiconductor laser element 10 can be fabricated.

As a result of measurement of the electric resistance value between the first part 62A and the second part 62B of the second electrode 62 of the fabricated semiconductor laser element 10 by a four-terminal method, the electric resistance value between the first part 62A and the second part 62B of the second electrode 62 was 15 kΩ when the width of the dividing groove 62C was 20 μm. In addition, in the fabricated semiconductor laser element 10, self-pulsation operation was able to be performed by producing a forward bias state by feeding a direct current from the first part 62A of the second electrode 62 to the first electrode 61 via the light emitting region 41, and applying an electric field to the saturable absorption region 42 by applying a reverse bias voltage $V_{sa}$ between the first electrode 61 and the second part 62B of the second electrode 62. That is, the electric resistance value between the first part 62A and the second part 62B of the second electrode 62 is equal to or more than 10 times the electric resistance value between the second electrode 62 and the first electrode 61, or equal to or more than $1 \times 10^2 \Omega$. Hence, a flow of leakage current from the first part 62A of the second electrode 62 to the second part 62B can be suppressed surely. As a result, it was possible to set the light emitting region 41 in a forward bias state, and surely set the saturable absorption region 42 in a reverse-bias state. It was thereby possible to make single-mode self-pulsation operation surely occur.

Second Embodiment

Figure 1B:
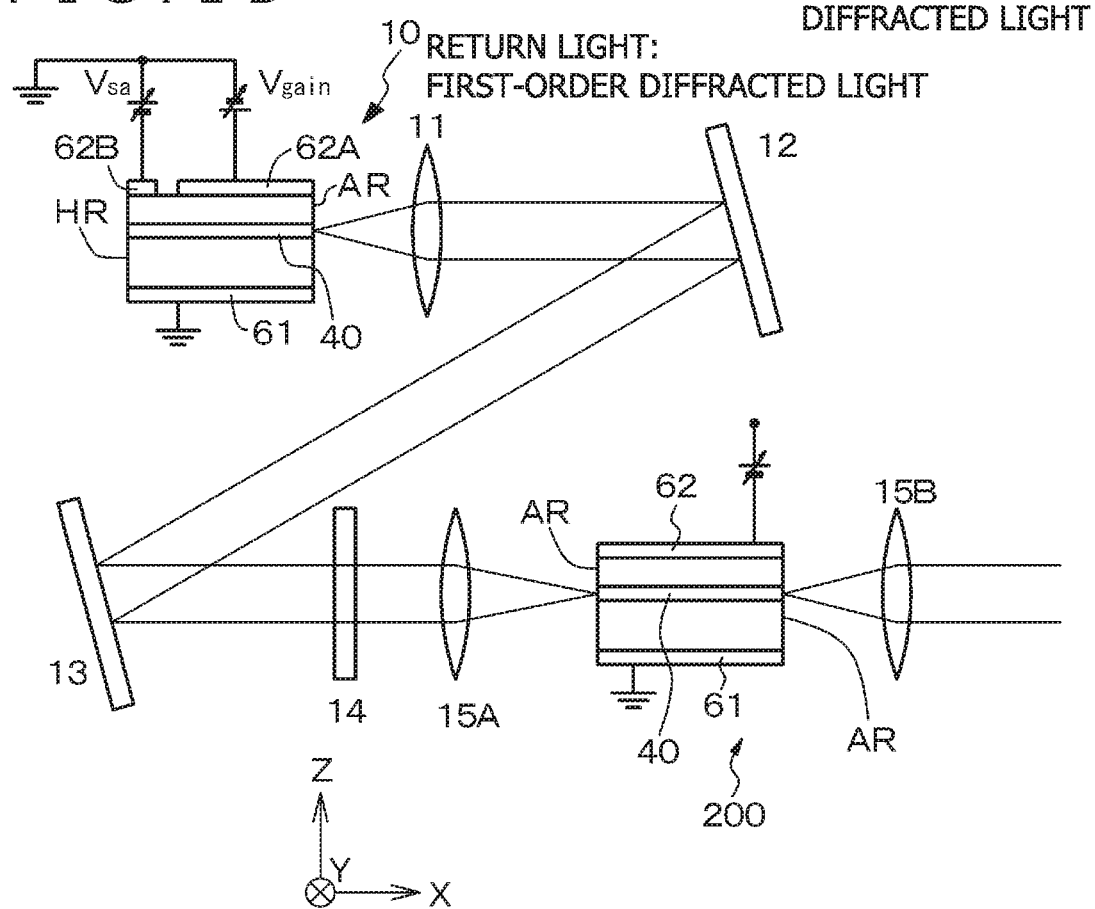

A second embodiment is a modification of the first embodiment. As depicted in FIG. 1B, which is a conceptual diagram of a semiconductor light emitting element, a semiconductor optical amplifier (SOA) 200 is provided which amplifies laser light emitted from the semiconductor laser element 10 and which is constituted of a laminated structure of III-V group nitride-based semiconductor layers. The semiconductor optical amplifier 200 amplifies laser light by a system referred to as "Master Oscillator Power Amplifier, MOPA." Here, the semiconductor optical amplifier directly amplifies an optical signal in a state of light without converting the optical signal into an electric signal. The semiconductor optical amplifier has a laser structure in which a resonator effect is eliminated as much as possible. The semiconductor optical amplifier amplifies incident light on the basis of the optical gain of the semiconductor optical amplifier. The semiconductor optical amplifier is formed by a well-known semiconductor optical amplifier.

Specifically, laser light emitted from the semiconductor laser element (mode-locked semiconductor laser element) 10 passes through collimating means (lens 11), an optical member (diffraction grating) 12, a reflecting mirror 13, an optical isolator 14, and condensing means (lens 15A, and enters the semiconductor optical amplifier 200. Then, the laser light output from the semiconductor optical amplifier 200 is output to the outside of the system through condensing means (lens 15B).

The semiconductor optical amplifier 200 includes the following: a laminated structure formed by sequentially laminating, on a base,
a first compound semiconductor layer 30 formed of a GaN-based compound semiconductor and having a first conductivity type,
a third compound semiconductor layer (active layer) 40 formed of a GaN-based compound semiconductor, and
a second compound semiconductor layer 50 formed of a GaN-based compound semiconductor and having a second conductivity type different from the first conductivity type;
a second electrode 62 formed on the second compound semiconductor layer 50; and
a first electrode 61 electrically connected to the first compound semiconductor layer 30.

Incidentally, the first compound semiconductor layer 30 is formed on a substrate (specifically a substrate 21). A forward bias voltage is applied from the second electrode 62 to the first electrode 61. In the semiconductor optical amplifier 200, the laser light is basically wave-guided only in one direction. The laser light that has entered the semiconductor optical amplifier 200 from a light incidence end surface is optically amplified within the semiconductor optical ampli-fier 200, output from a light emitting end surface on an opposite side, and output to the outside via the lens 15B.

The configuration and structure of the semiconductor optical amplifier 200 are essentially the same as the configuration and structure of the semiconductor laser element 10 except that the second electrode in the configuration and structure of the semiconductor optical amplifier 200 is not divided and except that the ridge stripe structure in the configuration and structure of the semiconductor optical amplifier 200 is not curved but is instead increased in width from the light incidence end surface (first end surface) toward the light emitting end surface (second end surface). Specifically, the semiconductor optical amplifier 200 is a taper type semiconductor optical amplifier having a device length of 3.0 mm and a flare width of 15 µm. Otherwise, the configuration and structure of the semiconductor optical amplifier 200 can be made essentially similar to the configuration and structure of the semiconductor laser element 10 in the first embodiment, and therefore detailed description thereof will be omitted.

Third Embodiment

A third embodiment is a modification of the first embodiment or the second embodiment, is specifically a modification of the mode-locked semiconductor laser element described in the first embodiment, and relates to the mode-locked semiconductor laser element of the third configuration. In the first embodiment, the semiconductor laser element 10 is disposed on the (0001) plane, that is, the C-plane of the n-type GaN substrate 21, which plane is a crystal plane having polarity. In a case where such a substrate is used, a quantum-confined stark effect (QCSE) of an internal electric field caused by piezopolarization and spontaneous polarization in the third compound semiconductor layer (active layer) 40 may make it difficult to control saturable absorption electrically. That is, it has been found that in some cases, the value of the direct current fed to the first electrode and the value of the reverse bias voltage applied to the saturable absorption region need to be increased to obtain self-pulsation operation and mode-locked operation, that a sub-pulse component accompanying a main pulse occurs, and that it becomes difficult to achieve synchronization between an external signal and an optical pulse.

Then, it has been found that in order to prevent the occurrence of such phenomena, it is desirable to optimize the thickness of a well layer constituting the third compound semiconductor layer (active layer) 40 and optimize impurity doping concentration in a barrier layer constituting the third compound semiconductor layer 40.

Specifically, it is desirable to set the thickness of a well layer constituting an InGaN quantum well active layer in a range between 1 nm and 10.0 nm both inclusive, preferably between 1 nm and 8 nm both inclusive. Effects of piezopolarization and spontaneous polarization can be reduced by thus reducing the thickness of the well layer. In addition, it is desirable to set the impurity doping concentration of the barrier layer in a range between $2 \times 10^{18}$ cm$^{-3}$ and $1 \times 10^{20}$ cm$^{-3}$ both inclusive, preferably between $1 \times 10^{19}$ cm$^{-3}$ and $1 \times 10^{20}$ cm$^{-3}$ both inclusive. Here, silicon (Si) or oxygen (O) can be cited as an impurity. Then, carriers of the active layer can be increased by making the impurity doping concentration of the barrier layer such a concentration. As a result, the effects of piezopolarization and spontaneous polarization can be reduced.

In the third embodiment, the configuration of the third compound semiconductor layer (active layer) 40 formed by the InGaN quantum well active layer constituted of the barrier layer and the well layer in the layer configuration depicted in Table 1 was set as in the following Table 2. In addition, in a mode-locked semiconductor laser element according to a reference example 3, the configuration of the third compound semiconductor layer 40 in the layer configuration depicted in Table 1 was set as in the following Table 2.

TABLE 2

| | Third Embodiment | Reference Example 3 |
|---|---|---|
| Well layer | 8 nm | 10.5 nm |
| Barrier layer | 12 nm | 14 nm |
| Impurity doping concentration of the well layer | Non-doped | Non-doped |
| Impurity doping concentration of the barrier layer | Si: $2 \times 10^{18}$ cm$^{-3}$ | Non-doped |

In the third embodiment, the thickness of the well layer is 8 nm, and the barrier layer is doped with $2 \times 10^{18}$ cm$^{-3}$ of Si, so that the QCSE effect within the active layer is alleviated. On the other hand, in the reference example 3, the thickness of the well layer is 10.5 nm, and the barrier layer is not doped with any impurity.

As in the first embodiment, mode locking is determined by a direct current applied to a light emitting region and a reverse bias voltage $V_{sa}$ applied to a saturable absorption region. Reverse bias voltage dependence of relation (L-I characteristic) between injection current and optical output in the third embodiment and the reference example 3 was measured. As a result, it has been found that in the reference example 3, a threshold current at which laser oscillation starts rises gradually as the reverse bias voltage $V_{sa}$ is increased, and further a change occurs at a lower reverse bias voltage $V_{sa}$ than in the third embodiment. This suggests that the effect of saturable absorption is electrically controlled by the reverse bias voltage $V_{sa}$ in the active layer of the third embodiment. However, also in the reference example 3, single-mode (single fundamental lateral mode) self-pulsation operation and mode-locked (mode lock) operation are confirmed in a state in which a reverse bias is applied to the saturable absorption region. It is therefore needless to say that the reference example 3 is also included in the present disclosure.

The present disclosure has been described above on the basis of preferred embodiments. However, the present disclosure is not limited to these embodiments. The configurations and structural constitutions of the semiconductor light emitting element assemblies, the semiconductor laser elements, the mode-locked semiconductor laser elements, and the semiconductor optical amplifiers described in the embodiments are illustrative, and can be changed as appropriate. In addition, while various values are indicated in the embodiments, these values are also illustrative, and are of course changed when the specifications of the semiconductor laser element and the semiconductor optical amplifier being used are changed, for example. For example, the axis of the semiconductor laser element and the semiconductor optical amplifier and the axis of the ridge stripe structure may intersect each other at a predetermined angle, and the planar shape of the ridge stripe structure may be a tapered shape.

Figure 8A:
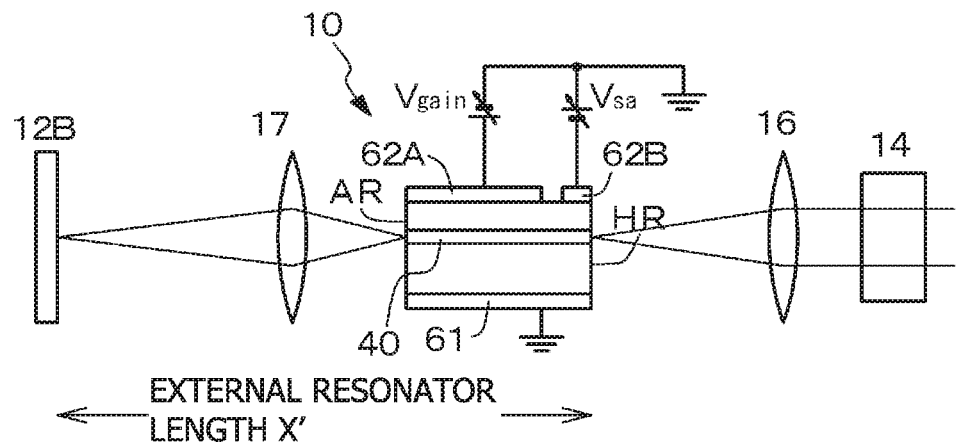
FIG. 8A, FIG. 8B, and FIG. 8C are conceptual diagrams of other modifications of the semiconductor light emitting element according to the first embodiment.
Figure 8B:
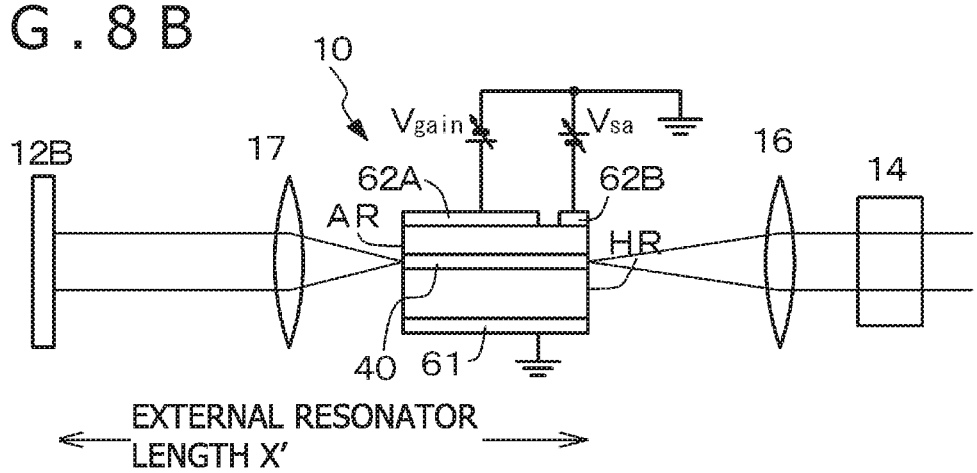
Figure 8C:
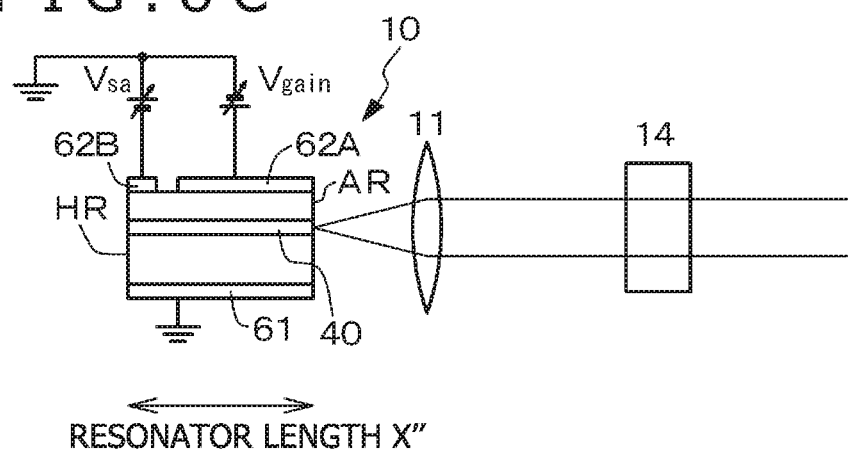

Modifications of the semiconductor light emitting element assembly in the first embodiment are depicted in FIG. 7A, FIG. 7B, FIG. 8A, FIG. 8B, and FIG. 8C. In a semiconductor light emitting element assembly depicted in FIG. 7A which assembly has a condensing type external resonator structure or a semiconductor light emitting element assembly depicted in FIG. 7B which assembly has a collimating type external resonator structure, an optical member 12A is formed by a semitransparent mirror. Laser light emitted from a semiconductor laser element 10 collides with the optical member (semitransparent mirror) 12A, and a part of the laser light is returned to the semiconductor laser element 10. Meanwhile, a remaining part passes through the optical member (semitransparent mirror) 12A, passes through condensing means (lens) 16 in some cases, and is emitted to the outside through an optical isolator 14. In a semiconductor light emitting element assembly depicted in FIG. 8A which assembly has a condensing type external resonator structure or a semiconductor light emitting element assembly depicted in FIG. 8B which assembly has a collimating type external resonator structure, an external resonator structure is constituted of the second end surface of a semiconductor laser element 10 and an optical member 12B formed by an external mirror (reflecting mirror), and a light beam is extracted from the semiconductor laser element 10. A low-reflection coating layer (AR) is formed on the second end surface. Alternatively, as depicted in FIG. 8C, the semiconductor laser element can also be of a monolithic type.

A laminated structure can have a structure in which a plurality of functional regions are integrated. In this case, at least one of the plurality of functional regions can be formed by a saturable absorption region. The functional regions include not only the saturable absorption region but also, for example, a gain region, a saturable absorption region, a phase control region, a distributed feedback region, a distributed Bragg reflection region, and the like.

Figure 9:
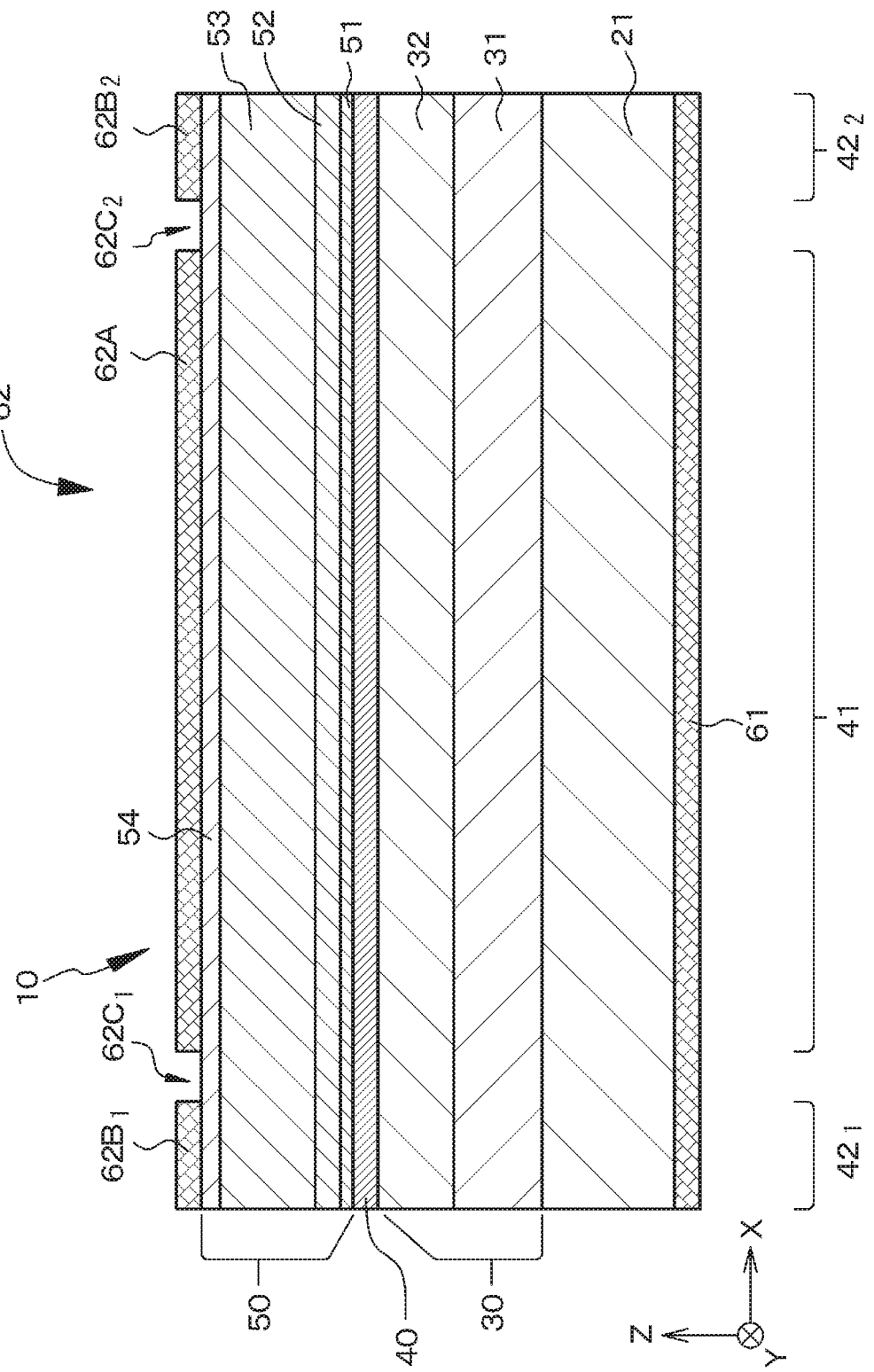
FIG. 9 is a schematic end view of a modification of a mode-locked semiconductor laser element according to the first embodiment, the schematic end view being taken along an extending direction of a resonator.
Figure 10:
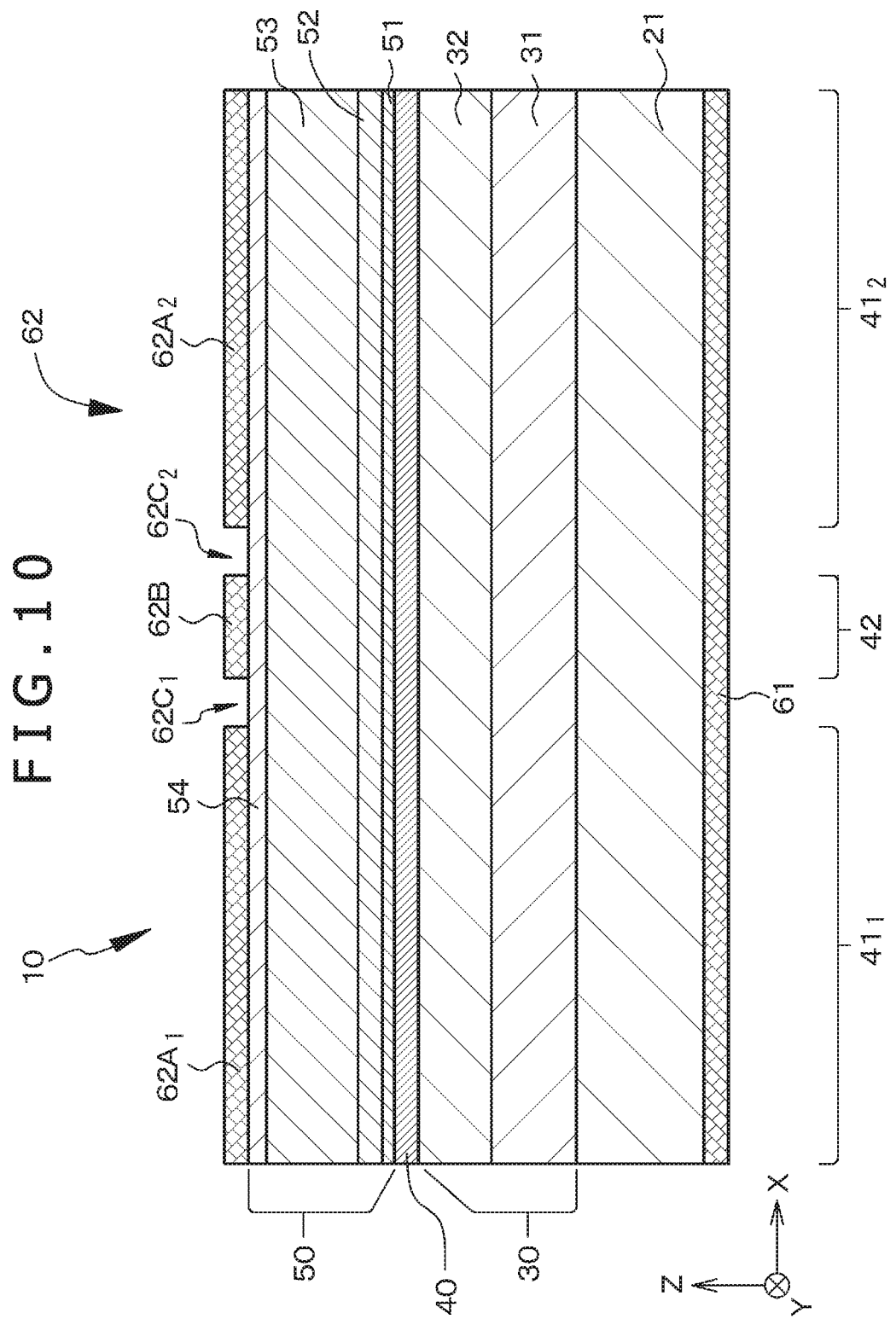
FIG. 10 is a schematic end view of another modification of the mode-locked semiconductor laser element according to the first embodiment, the schematic end view being taken along an extending direction of a resonator.

The numbers of light emitting regions 41 and saturable absorption regions 42 are not limited to one. FIG. 9 is a schematic end view of a mode-locked semiconductor laser element (multi-section type (multi-electrode type) semiconductor laser element) in which one first part 62A of a second electrode and two second parts 62B$_1$ and 62B$_2$ of the second electrode are provided. In the mode-locked semiconductor laser element depicted in FIG. 9, one end of the first part 62A is opposed to one second part 62B$_1$ with one dividing groove 62C$_1$ interposed therebetween, and another end of the first part 62A is opposed to the other second part 62B$_2$ with another dividing groove 62C$_2$ interposed therebetween. Then, one light emitting region 41 is interposed between two saturable absorption regions 42$_1$ and 42$_2$. Alternatively, FIG. 10 is a schematic end view of a mode-locked semiconductor laser element in which two first parts 62A$_1$ and 62A$_2$ of a second electrode and one second part 62B of the second electrode are provided. In this mode-locked semiconductor laser element, an end portion of the second part 62B is opposed to one first part 62A$_1$ with one dividing groove 62C$_1$ interposed therebetween, and another end of the second part 62B is opposed to the other first part 62A$_2$ with another dividing groove 62C$_2$ interposed therebetween. Then, one saturable absorption region 42 is interposed between two light emitting regions 41$_1$ and 41$_2$.

Figure 11:
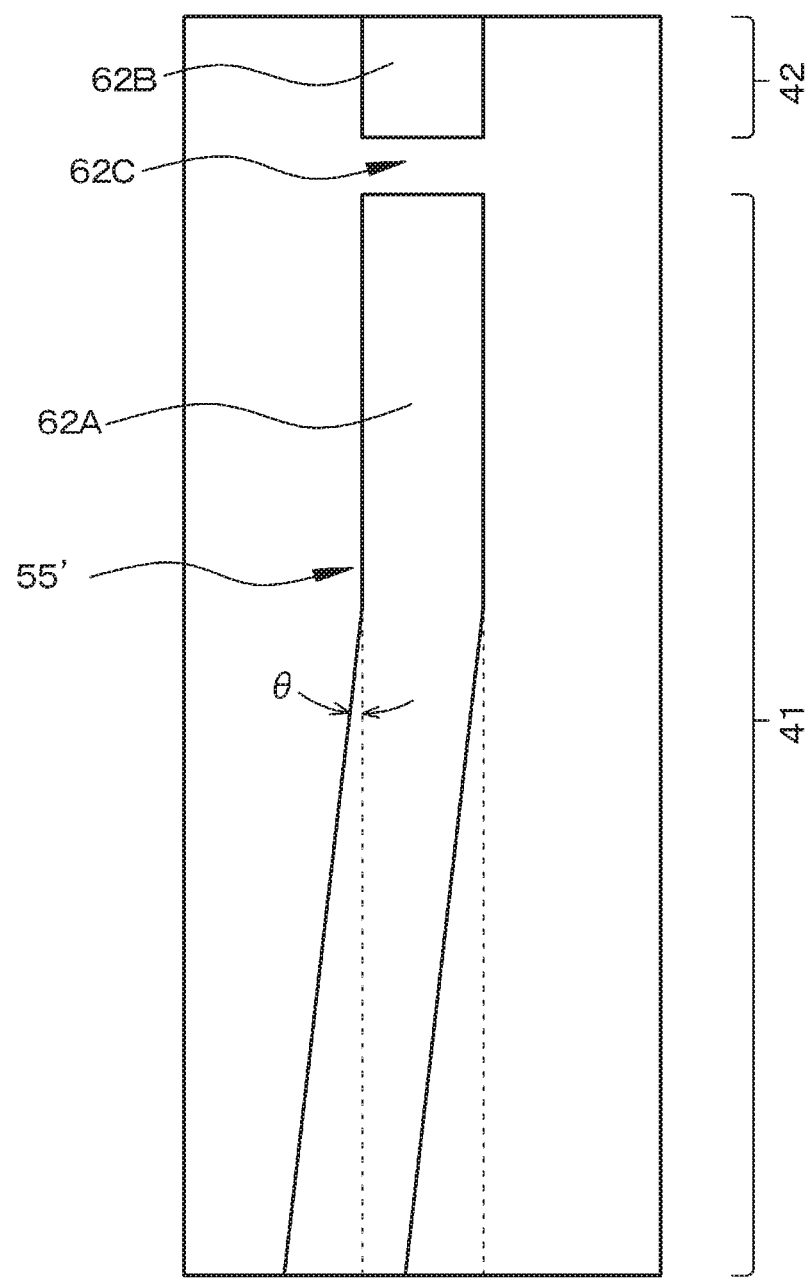
FIG. 11 is a schematic diagram of a ridge stripe structure in yet another modification of the mode-locked semiconductor laser element according to the first embodiment as viewed from above.

The semiconductor laser element can be a semiconductor laser element of an oblique ridge stripe type separate confinement heterostructure having an oblique waveguide. FIG. 11 is a schematic diagram of a ridge stripe structure 55' in such a semiconductor laser element as viewed from above. This mode-locked semiconductor laser element has a structure formed by combining two linear ridge stripe structures with each other. It is desirable that the value of an angle θ at which the two ridge stripe structures intersect each other be, for example, 0<θ≤10 (degrees), preferably, 0<θ≤6 (degrees).

Employing the oblique ridge stripe type can bring the reflectance of the antireflection-coated second end surface closer to an ideal value of 0%. As a result, it is possible to obtain advantages of being able to prevent the generation of laser light going around within the semiconductor laser element and suppress generation of secondary laser light accompanying main laser light.

In the embodiments, the semiconductor laser element and the semiconductor optical amplifier are disposed on the C-plane, that is, the {0001} plane, which is a polar plane of the n-type GaN substrate. Incidentally, in such a case, the QCSE effect (quantum-confined Stark effect) of an internal electric field caused by piezopolarization and spontaneous polarization in the third compound semiconductor layer (active layer) may make it difficult to control saturable absorption electrically. That is, in some cases, the value of the direct current fed to the first electrode and the value of the reverse bias voltage applied to the saturable absorption region may need to be increased to obtain self-pulsation operation and mode-locked operation, a sub-pulse component accompanying a main pulse may occur, and it may become difficult to achieve synchronization between an external signal and an optical pulse. In order to suppress occurrence of such phenomena, it suffices to dispose the semiconductor laser element and the semiconductor optical amplifier on a nonpolar plane such as an A-plane as a {11−20} plane, an M-plane as a {1−100} plane, or a {1−102} plane or on a semipolar plane such as a {11−2n} plane including a {11−24} plane and a {11−22} plane, a {10−11} plane, or a {10−12} plane. Thereby, even if piezopolarization and spontaneous polarization occur in the third compound semiconductor layer (active layer) of the semiconductor laser element or the semiconductor optical amplifier, the piezopolarization does not occur in the thickness direction of the third compound semiconductor layer, but the piezopolarization occurs in a direction substantially at a right angle to the thickness direction of the third compound semiconductor layer. Therefore adverse effects caused by the piezopolarization and spontaneous polarization can be eliminated. The {11−2n} plane refers to a nonpolar plane forming approximately 40 degrees with the C-plane. In addition, when the semiconductor laser element 10 is disposed on a nonpolar plane or on a semipolar plane, it is possible to eliminate the limitation of the thickness of the well layer (between 1 nm and 10 nm both inclusive) and the limitation of the impurity doping concentration of the barrier layer (between $2\times10^{18}$ cm$^{-3}$ and $1\times10^{20}$ cm$^{-3}$ both inclusive) as described in the third embodiment.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims. Incidentally, the present disclosure can have the following configurations.

[A01] <<Semiconductor Light Emitting Element Assembly: First Mode>>

A semiconductor light emitting element assembly including:

a semiconductor light emitting element having a laminated structure formed by laminating a first compound semiconductor layer, an active layer, and a second compound semiconductor layer;

the semiconductor light emitting element assembly satisfying $$\Delta I_2 > \Delta I_1$$

where $\Delta I_1$ is an operating current range when temperature of the active layer is $T_1$, and $\Delta I_2$ is the operating current range when the temperature of the active layer is $T_2$ (where $T_2 > T_1$).

[A02]

The semiconductor light emitting element assembly according to [A01], wherein an operating current when an optical pulse repetition frequency changes from a fundamental frequency determined by a distance of an optical system to a frequency twice the fundamental frequency is an upper limit value of the operating current range.

[A03]

The semiconductor light emitting element assembly according to [A01] or [A02], wherein the semiconductor light emitting element assembly satisfies $$I_{max-2} > I_{max-1}$$

where $I_{max-1}$ is an upper limit value of the operating current range when the temperature of the active layer is $T_1$, and $I_{max-2}$ is the upper limit value of the operating current range when the temperature of the active layer is $T_2$.

[A04] <<Semiconductor Light Emitting Element Assembly: Second Mode>>

A semiconductor light emitting element assembly including:

a semiconductor light emitting element having a laminated structure formed by laminating a first compound semiconductor layer, an active layer, and a second compound semiconductor layer;

the semiconductor light emitting element assembly satisfying $$P_2 > P_1$$

where $P_1$ is a maximum optical output emitted when temperature of the active layer is $T_1$, and $P_2$ is the maximum optical output emitted when the temperature of the active layer is $T_2$ (where $T_2 > T_1$).

[A05]

The semiconductor light emitting element assembly according to any one of [A01] to [A04], further including:

a heat sink; and a sub-mount, wherein the heat sink, the sub-mount, and the semiconductor light emitting element are sequentially laminated.

[A06]

The semiconductor light emitting element assembly according to [A05], wherein the sub-mount is formed of AlN, Si, SiC, Cu, W, Mo, Al, or diamond, or composite materials including these materials.

[A07]

The semiconductor light emitting element assembly according to [A05] or [A06], wherein the temperature of the active layer is controlled by the heat sink.

[A08]

The semiconductor light emitting element assembly according to [A07], wherein
the temperature of the active layer is controlled by heating the heat sink.

[A09]

The semiconductor light emitting element assembly according to any one of [A01] to [A08], wherein
the laminated structure has a structure in which a light emitting region and a saturable absorption region are juxtaposed to each other in a resonator direction.

[A10]

The semiconductor light emitting element assembly according to [A09], wherein
the saturable absorption region is disposed in an end region of the laminated structure in the resonator direction.

[A11]

The semiconductor light emitting element assembly according to [A09] or [A10], wherein
a current fed to the light emitting region is $1 \times 10^2$ amperes/cm$^2$ to $1 \times 10^5$ amperes/cm$^2$ per unit area of the light emitting region.

[A12]

The semiconductor light emitting element assembly according to any one of [A01] to [A08], wherein
the laminated structure has a structure in which a plurality of functional regions are integrated.

[A13]

The semiconductor light emitting element assembly according to [A12], wherein
at least one of the plurality of functional regions is formed by a saturable absorption region.

[B01] <<Semiconductor Light Emitting Element: First Mode>>

A semiconductor light emitting element including:
a laminated structure formed by laminating a first compound semiconductor layer, an active layer, and a second compound semiconductor layer;
the semiconductor light emitting element satisfying $$\Delta I_2 > \Delta I_1$$

where $\Delta I_1$ is an operating current range when temperature of the active layer is $T_1$, and $\Delta I_2$ is the operating current range when the temperature of the active layer is $T_2$ (where $T_2 > T_1$).

[B02]

The semiconductor light emitting element according to [B01], wherein
an operating current when an optical pulse repetition frequency changes from a fundamental frequency determined by a distance of an optical system to a frequency twice the fundamental frequency is an upper limit value of the operating current range.

[B03]

The semiconductor light emitting element according to [B01] or [B02], wherein
the semiconductor light emitting element satisfies $$I_{max-2} > I_{max-1}$$

where $I_{max-1}$ is an upper limit value of the operating current range when the temperature of the active layer is $T_1$, and $I_{max-2}$ is the upper limit value of the operating current range when the temperature of the active layer is $T_2$.

[B04] <<Semiconductor Light Emitting Element: Second Mode>>

A semiconductor light emitting element including:
a laminated structure formed by laminating a first compound semiconductor layer, an active layer, and a second compound semiconductor layer;
the semiconductor light emitting element satisfying $$P_2 > P_1$$

where $P_1$ is a maximum optical output emitted when temperature of the active layer is $T_1$, and $P_2$ is the maximum optical output emitted when the temperature of the active layer is $T_2$ (where $T_2 > T_1$).

[B05]

The semiconductor light emitting element according to any one of [B01] to [B04], wherein
the laminated structure has a structure in which a light emitting region and a saturable absorption region are juxtaposed to each other in a resonator direction.

[B06]

The semiconductor light emitting element according to [B05], wherein
the saturable absorption region is disposed in an end region of the laminated structure in the resonator direction.

[B07]

The semiconductor light emitting element according to [B05] or [B06], wherein
a current fed to the light emitting region is $1 \times 10^2$ amperes/cm$^2$ to $1 \times 10^5$ amperes/cm$^2$ per unit area of the light emitting region.

[B08]

The semiconductor light emitting element according to any one of [B01] to [B04], wherein
the laminated structure has a structure in which a plurality of functional regions are integrated.

[B09]

The semiconductor light emitting element according to [B08], wherein
at least one of the plurality of functional regions is formed by a saturable absorption region.

REFERENCE SIGNS LIST

10 . . . Semiconductor light emitting element (semiconductor laser element, mode-locked semiconductor laser element), 11 . . . Collimating means (lens), 12, 12A, 12B . . . Optical member, 13 . . . Reflecting mirror, 14 . . . Optical isolator, 15A, 15B, 16, 17 . . . Condensing means (lens), 21 . . . Base (substrate), 22 . . . Pad electrode, 30 . . . First compound semiconductor layer, 31 . . . n-type AlGaN cladding layer, 32 . . . n-type GaN cladding layer, 40 . . . Third compound semiconductor layer (active layer), 41, 41$_1$, 41$_2$ . . . Light emitting region, 42, 42$_1$, 42$_2$ . . . Saturable absorption region, 50 . . . Second compound semiconductor layer, 51 . . . Non-doped InGaN light guide layer, 52 . . . p-type AlGaN electronic barrier layer (Mg-doped), 53 . . . p-type GaN (Mg-doped)/AlGaN superlattice cladding layer, 54 . . . p-type GaN contact layer (Mg-doped), 55, 55' . . . Ridge stripe structure, 56 . . . Laminated insulating film, 61 . . . First electrode, 62 . . . Second electrode, 62A, 62A$_1$, 62A$_2$ . . . First part of the second electrode, 62B, 62B$_1$, 62B$_2$ . . . Second part of the second electrode, 62C, 62C$_1$, 62C$_2$ . . . Dividing groove, 63 . . . Pd single layer, 64 . . . Resist layer, 65 . . . Opening portion provided in the resist layer,

101 . . . Heat sink, 102, 103 . . . Soldering layer, 104 . . . Sub-mount, 200 . . . Semiconductor optical amplifier

The invention claimed is:

1. A semiconductor light emitting element assembly comprising:
   a semiconductor light emitting element having a laminated structure formed by laminating a first compound semiconductor layer, an active layer, and a second compound semiconductor layer;
   the semiconductor light emitting element assembly satisfying $\Delta I_2 > \Delta I_1$,
   wherein $\Delta I_1$ is a first operating current range when temperature of the active layer is $T_1$, and $\Delta I_2$ is a second operating current range when the temperature of the active layer is $T_2$, and $T_2 > T_1$, and
   wherein an operating current when an optical pulse repetition frequency changes from a fundamental frequency determined by a distance of an optical system to a frequency twice the fundamental frequency is an upper limit value of an operating current range of the semiconductor light emitting element.

2. The semiconductor light emitting element assembly according to claim 1, wherein
   the semiconductor light emitting element assembly satisfies $I_{max-2} > I_{max-1}$,
   wherein $I_{max-1}$ is an upper limit value of the operating current range when the temperature of the active layer is $T_1$, and $I_{max-2}$ is the upper limit value of the operating current range when the temperature of the active layer is $T_2$.

3. The semiconductor light emitting element assembly according to claim 1, further comprising:
   a heat sink; and
   a sub-mount, wherein
   the heat sink, the sub-mount, and the semiconductor light emitting element are sequentially laminated.

4. The semiconductor light emitting element assembly according to claim 3, wherein
   the sub-mount is formed of AlN, Si, SiC, Cu, W, Mo, Al, or diamond, or composite materials including these materials.

5. The semiconductor light emitting element assembly according to claim 3, wherein the temperature of the active layer is controlled by the heat sink.

6. The semiconductor light emitting element assembly according to claim 5, wherein the temperature of the active layer is controlled by heating the heat sink.

7. The semiconductor light emitting element assembly according to claim 1, wherein
   the laminated structure has a structure in which a light emitting region and a saturable absorption region are juxtaposed to each other in a resonator direction.

8. The semiconductor light emitting element assembly according to claim 7, wherein
   the saturable absorption region is disposed in an end region of the laminated structure in the resonator direction.

9. The semiconductor light emitting element assembly according to claim 7, wherein
   a current fed to the light emitting region is $1 \times 10^2$ amperes/cm$^2$ to $1 \times 10^5$ amperes/cm$^2$ per unit area of the light emitting region.

10. The semiconductor light emitting element assembly according to claim 1, wherein
    the laminated structure has a structure in which a plurality of functional regions are integrated.

11. The semiconductor light emitting element assembly according to claim 10, wherein
    at least one of the plurality of functional regions is formed by a saturable absorption region.

12. The semiconductor light emitting element assembly according to claim 1, wherein the second compound semiconductor layer includes an InGaN light guide layer and a p-type AlGaN electronic barrier layer, and wherein the InGaN light guide layer is directly coupled to the p-type AlGaN electronic barrier layer, and the active layer is directly coupled to the InGaN light guide layer opposite the p-type AlGaN electronic barrier layer.

13. A semiconductor light emitting element assembly comprising:
    a semiconductor light emitting element having a laminated structure formed by laminating a first compound semiconductor layer, an active layer, and a second compound semiconductor layer;
    the semiconductor light emitting element assembly satisfying $P_2 > P_1$,
    wherein $P_1$ is a maximum optical output emitted when temperature of the active layer is $T_1$, and $P_2$ is the maximum optical output emitted when the temperature of the active layer is $T_2$, and $T_2 > T_1$, and
    wherein an operating current when an optical pulse repetition frequency changes from a fundamental frequency determined by a distance of an optical system to a frequency twice the fundamental frequency is an upper limit value of an operating current range of the semiconductor light emitting element.

14. The semiconductor light emitting element assembly according to claim 13, wherein the second compound semiconductor layer includes an InGaN light guide layer and a p-type AlGaN electronic barrier layer, and wherein the InGaN light guide layer is directly coupled to the p-type AlGaN electronic barrier layer, and the active layer is directly coupled to the InGaN light guide layer opposite the p-type AlGaN electronic barrier layer.

15. A semiconductor light emitting element comprising:
    a laminated structure formed by laminating a first compound semiconductor layer, an active layer, and a second compound semiconductor layer;
    the semiconductor light emitting element satisfying $\Delta I_2 > \Delta I_1$,
    wherein $\Delta I_1$ is a first operating current range when temperature of the active layer is $T_1$, and $\Delta I_2$ is a second operating current range when the temperature of the active layer is $T_2$, and $T_2 > T_1$, and
    wherein an operating current when an optical pulse repetition frequency changes from a fundamental frequency determined by a distance of an optical system to a frequency twice the fundamental frequency is an upper limit value of an operating current range of the semiconductor light emitting element.

16. The semiconductor light emitting element according to claim 15, wherein the second compound semiconductor layer includes an InGaN light guide layer and a p-type AlGaN electronic barrier layer, and wherein the InGaN light guide layer is directly coupled to the p-type AlGaN electronic barrier layer, and the active layer is directly coupled to the InGaN light guide layer opposite the p-type AlGaN electronic barrier layer.

17. A semiconductor light emitting element comprising:
    a laminated structure formed by laminating a first compound semiconductor layer, an active layer, and a second compound semiconductor layer;

the semiconductor light emitting element satisfying $P_2 > P_1$, wherein $P_1$ is a maximum optical output emitted when temperature of the active layer is $T_1$, and $P_2$ is the maximum optical output emitted when the temperature of the active layer is $T_2$, and $T_2 > T_1$, and wherein an operating current when an optical pulse repetition frequency changes from a fundamental frequency determined by a distance of an optical system to a frequency twice the fundamental frequency is an upper limit value of an operating current range of the semiconductor light emitting element.

18. The semiconductor light emitting element according to claim 17, wherein the second compound semiconductor layer includes an InGaN light guide layer and a p-type AlGaN electronic barrier layer, and wherein the InGaN light guide layer is directly coupled to the p-type AlGaN electronic barrier layer, and the active layer is directly coupled to the InGaN light guide layer opposite the p-type AlGaN electronic barrier layer.

* * * * *